(12) United States Patent
Park et al.

(10) Patent No.: US 10,139,726 B2
(45) Date of Patent: Nov. 27, 2018

(54) IMPRINT LITHOGRAPHY METHOD, MASTER TEMPLATE FOR IMPRINT, WIRE GRID POLARIZER MANUFACTURED USING THE MASTER TEMPLATE AND DISPLAY SUBSTRATE HAVING THE SAME

(71) Applicant: Samsung Display Co., Ltd., Yongin-si (KR)

(72) Inventors: Seung-Won Park, Seoul (KR); Taewoo Kim, Seoul (KR); Lei Xie, Suwon-si (KR); Daehwan Jang, Seoul (KR); Dae-Young Lee, Seoul (KR); Gugrae Jo, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/594,645

(22) Filed: May 14, 2017

(65) Prior Publication Data

US 2017/0336547 A1 Nov. 23, 2017

(30) Foreign Application Priority Data

May 19, 2016 (KR) .................. 10-2016-0061705

(51) Int. Cl.
*G03F 7/00* (2006.01)
*G02B 5/30* (2006.01)
(Continued)

(52) U.S. Cl.
CPC ............ *G03F 7/0002* (2013.01); *G02B 5/00* (2013.01); *G02B 5/3058* (2013.01); *G02F 1/00* (2013.01);
(Continued)

(58) Field of Classification Search
CPC . G03F 7/0002; G03F 1/80; G03F 1/60; G02F 1/133528; G02F 1/00;
(Continued)

(56) References Cited

U.S. PATENT DOCUMENTS 8,703,406 B2 4/2014 Schaper
2007/0187875 A1* 8/2007 Terasaki ................. B82Y 10/00
264/496

(Continued)

FOREIGN PATENT DOCUMENTS

KR 2015-0113438 10/2015
WO 2009/020196 2/2009

OTHER PUBLICATIONS

L. Jay Guo, Nanoimprint Lithography: Methods and Material Requirements, Advanced Materials, pp. 495-513, Wiley-VCH Verlag GmbH & Co. KGaA, Weinheim.

(Continued)

*Primary Examiner* — Yasser A Abdelaziez
(74) *Attorney, Agent, or Firm* — H.C. Park & Associates, PLC

(57) ABSTRACT

An imprint lithography method includes forming a first imprint pattern on a substrate in a first area and a third area, wherein the third area is spaced apart from the first area, forming a first resist pattern on the substrate on a second area, wherein the second area is adjacent the first and third areas, forming a first pattern in the first and third areas by etching an element under the first imprint pattern using the first imprint pattern and the first resist pattern as an etch barrier, forming a second imprint pattern on the substrate in a second area, forming a second resist pattern on the substrate on the first area and the third area, and forming a second pattern in the second area by etching an element (Continued)

under the second imprint pattern using the second imprint pattern and the second resist pattern as an etch barrier.

10 Claims, 46 Drawing Sheets

(51) Int. Cl.
*G02F 1/1335* (2006.01)
*G03F 1/60* (2012.01)
*G03F 1/80* (2012.01)
*H01L 27/12* (2006.01)
*G02B 5/00* (2006.01)
*G02F 1/00* (2006.01)

(52) U.S. Cl.
CPC .......... *G02F 1/133528* (2013.01); *G03F 1/60* (2013.01); *G03F 1/80* (2013.01); *H01L 27/124* (2013.01); *H01L 27/1218* (2013.01); *H01L 27/1259* (2013.01); *G02F 2001/133548* (2013.01)

(58) Field of Classification Search
CPC .......... G02F 2001/133548; G02B 5/00; G02B 5/3058; H01L 27/1218; H01L 27/1259; H01L 27/124
See application file for complete search history.

(56) References Cited

U.S. PATENT DOCUMENTS

| | | |
|---|---|---|
| 2009/0189306 A1 | 7/2009 | Terasaki et al. |
| 2010/0072667 A1 | 3/2010 | Kawakami et al. |
| 2010/0140220 A1* | 6/2010 | Cho .................. B82Y 10/00 216/41 |
| 2011/0143544 A1 | 6/2011 | Goto et al. |
| 2013/0153534 A1 | 6/2013 | Resnick et al. |
| 2015/0323721 A1 | 11/2015 | Chung et al. |

OTHER PUBLICATIONS

Extended Eruopean Search Report dated Sep. 28, 2017, in European Patent Application No. 17163237.5.

* cited by examiner

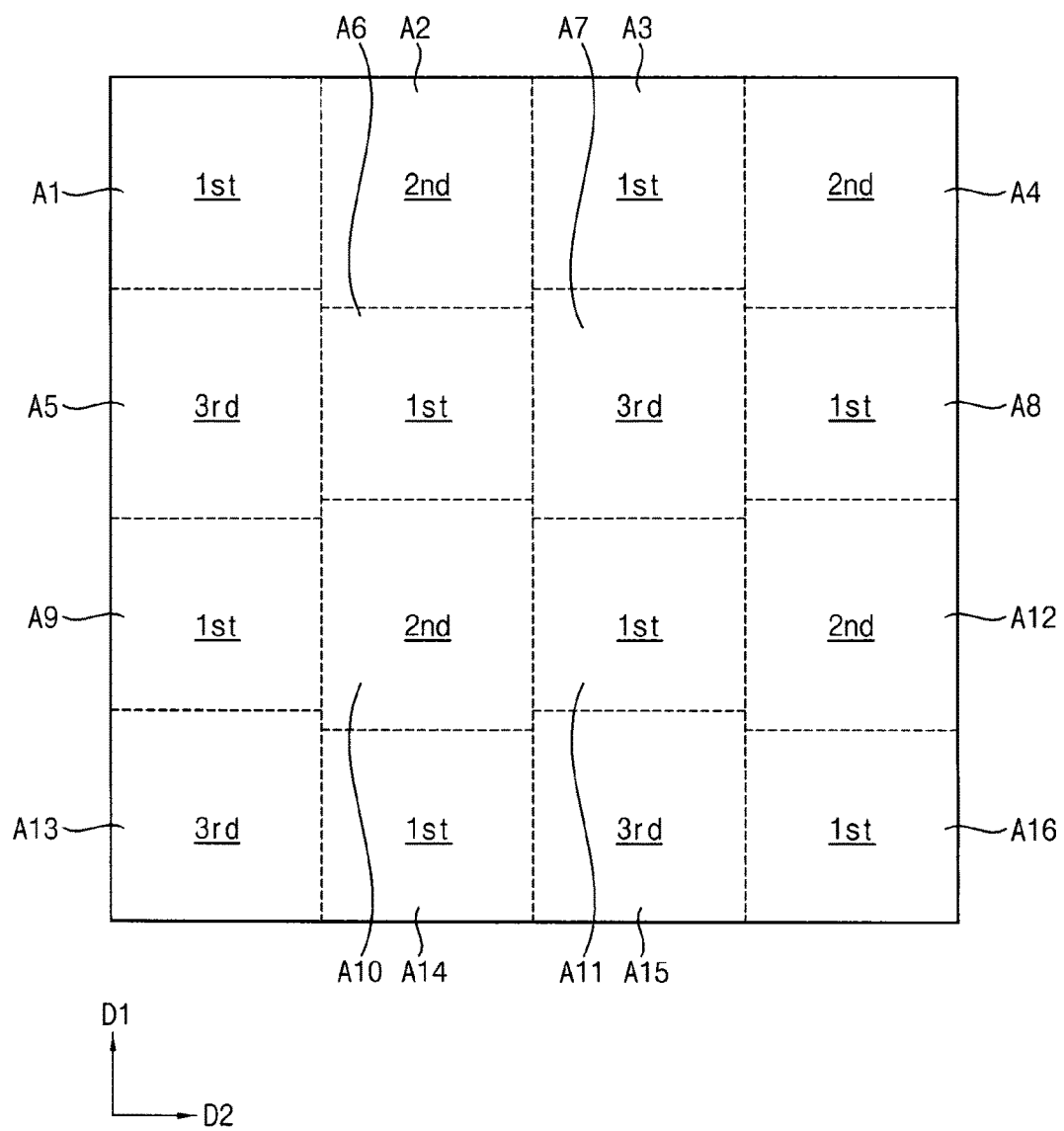

IMPRINT LITHOGRAPHY METHOD, MASTER TEMPLATE FOR IMPRINT, WIRE GRID POLARIZER MANUFACTURED USING THE MASTER TEMPLATE AND DISPLAY SUBSTRATE HAVING THE SAME

CROSS-REFERENCE TO RELATED APPLICATION

This application claims priority from and the benefit of Korean Patent Application No. 10-2016-0061705, filed on May 19, 2016, which is hereby incorporated by reference for all purposes as if fully set forth herein.

BACKGROUND

Field

Exemplary embodiments of the inventive concept relate to an imprint lithography method, a master template for imprinting, a wire grid polarizer manufactured using the master template, and a display substrate including the wire grid polarizer. More particularly, exemplary embodiments of the inventive concept relate to a large area imprint lithography method, a master template for large area imprinting, a wire grid polarizer manufactured using the master template, a display substrate including the wire grid polarizer.

Discussion of the Background

Recently, a display apparatus having low weight and small size has been manufactured. A cathode ray tube (CRT) display apparatus was previously used due to its performance and competitive price. However CRT displays have disadvantages in size and/or portability. Therefore, display devices such as a plasma display apparatus, a liquid crystal display apparatus, and an organic light emitting display apparatus are highly regarded due to their small size, low weight, and low power consumption.

The liquid crystal display apparatus applies a voltage to a specific molecular arrangement in order to change that molecular arrangement. The liquid crystal display apparatus displays an image using changes of optical properties (for example, birefringence, rotatory polarization, dichroism, and light scattering) of a liquid crystal cell according to the changes of the molecular arrangement.

The liquid crystal display apparatus includes a polarizer, a display panel, an optical sheet, and a backlight assembly. Recently, the polarizer has been formed inside of the display panel (in-cell polarizer). For example, a wire grid polarizer may be used. The wire grid polarizer may be formed by an imprint lithography process. However, a size of the master template for the imprint lithography process is limited, so that it is difficult to manufacture a large size panel.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide provides an imprint lithography method capable of large area process.

Exemplary embodiments also provide a master template manufactured by the method.

Exemplary embodiments also provide a wire grid polarizer manufactured using the master template, Exemplary embodiments also provide a display substrate including the wire grid polarizer.

Additional aspects will be set forth in the detailed description which follows, and, in part, will be apparent from the disclosure, or may be learned by practice of the inventive concept.

An exemplary embodiment discloses an imprint lithography method that includes forming a first imprint pattern on a substrate in a first area and a third area, wherein the third area is spaced apart from the first area, forming a first resist pattern on the substrate on a second area, wherein the second area is adjacent the first and third areas, forming a first pattern in the first and third areas by etching an element under the first imprint pattern using the first imprint pattern and the first resist pattern as an etch barrier, forming a second imprint pattern on the substrate in a second area, forming a second resist pattern on the substrate on the first area and the third area, and forming a second pattern in the second area by etching an element under the second imprint pattern using the second imprint pattern and the second resist pattern as an etch barrier.

In an exemplary embodiment, in forming the first imprint pattern, the first imprint pattern in the third area may be formed after the first imprint pattern in the first area is formed.

In an exemplary embodiment, forming the first imprint pattern may further include providing a resin solution on the substrate in the first area and the third area, and forming the first imprint pattern from the resin solution using an imprint mold. Forming the second imprint pattern may include providing the resin solution on the substrate on which the first pattern is formed in the second area, and forming the second imprint pattern from the resin solution using the imprint mold.

In an exemplary embodiment, in forming the first imprint pattern, the first imprint pattern may be flowed out of the first and third areas. The first imprint pattern may include an overflowed portion which is formed at an area outside of and adjacent to the first and third areas.

In an exemplary embodiment, in forming the first resist pattern, the first resist pattern may cover the overflowed portion of the first imprint pattern.

In an exemplary embodiment, in forming the second resist pattern, a second area where the first imprint pattern may be formed is larger than the first and third areas.

In an exemplary embodiment, in forming the first imprint pattern from the resin solution may include forming a first preliminary pattern from the resin solution using the imprint mold, and overall etching the first preliminary pattern to form the first imprint pattern. The first preliminary pattern may include a residual layer and plurality of protrusions on the residual layer. The first imprint pattern is formed by etching the residual layer between the protrusions. Forming the second imprint pattern from the resin solution may include forming a second preliminary pattern from the resin solution using the imprint mold, and overall etching the second preliminary pattern to form the second imprint pattern. The second preliminary pattern may include a residual layer and plurality of protrusions on the residual layer. The second imprint pattern may be formed by etching the residual layer between the protrusions.

In an exemplary embodiment, in forming the first imprint pattern may further include forming a mask layer on the substrate before providing the resin solution.

In an exemplary embodiment, the imprint lithography method may further include forming a third imprint pattern on the substrate in a fourth area which makes contact with the first, second and third areas, forming a third resist pattern on the first, second, and third areas, and forming a third pattern in the fourth area by etching an element under the third imprint pattern using the third imprint pattern and the third resist pattern as an etch barrier.

In an exemplary embodiment, a boundary between each of the first to third areas may be discontinuously extended.

An exemplary embodiment also discloses a master template for imprinting that includes a base substrate, a pattern formed on the base substrate, a first stitch line extending in a first direction, and a second stitch line extending in a second direction which crosses the first direction. The pattern is evenly formed on all of the base substrate except for the first and second stitch lines, the first and second stitch lines are where the pattern is unevenly formed. The second stitch line comprises a first portion and a second portion, which are discontinuous from each other.

In an exemplary embodiment, the first stitch line and the second stitch line may divide the substrate into a plurality of areas. A point where the first stitch line and the second stitch line meet each other may make contact with three or less of the plurality of areas.

In an exemplary embodiment, the pattern may be a wire grid polarizer pattern.

In an exemplary embodiment, the wire grid pattern may have a pitch of 50 nm (nanometer) to 150 nm.

In an exemplary embodiment, the polarizing function where the first and second stitch lines are formed may be lower than an area where the wire grid pattern is formed.

In an exemplary embodiment, each of the first and second stitch lines may be a line pattern or a blank pattern.

In an exemplary embodiment, a width of the first and second stitch lines may be wider than line width of the wire grid pattern.

In an exemplary embodiment, diagonal length of the base substrate may be larger than 300 mm.

An exemplary embodiment further discloses a wire grid polarizer that includes a base substrate, a wire grid pattern, a first stitch line extending in a first direction, and a second stitch line extending in a second direction which crosses the first direction. The wire grid polarizer also includes a first portion and a second portion which are discontinuous from each other. The wire grid pattern is evenly formed on all of the base substrate except for where the first and second stitch lines exist. The first and second stitch lines are where the wire grid pattern is unevenly formed.

In an exemplary embodiment, the wire grid pattern comprises a plurality of fine wires, and a width of the first and second stitch lines may be larger (wider) than the width of the fine wire.

In an exemplary embodiment, the first and second stitch lines may have different shape and size from the fine wires of the wire grid pattern.

An exemplary embodiment also discloses a display substrate that includes a base substrate, a polarizer layer disposed on the base substrate, and a thin film transistor disposed on the polarizer layer. The polarizer layer includes a first stitch line extending in a first direction, a second stitch line extending in a second direction which crosses the first direction, and a wire grid pattern disposed in areas which are divided by the first and second stitch lines. The second stitch line includes a first portion and a second portion which are discontinuous from each other.

In an exemplary embodiment, the first and second stitch lines may have a different shape and size from fine wires of the wire grid pattern.

In an exemplary embodiment, a width of the first and second stitch lines may be wider than a line width of the wire grid pattern.

According to the exemplary embodiments of the present inventive concept, a master template for large area process and a wire grid polarizer may be manufactured by an imprint lithography method. For example, the master template for imprint may be formed by the method, and then an imprint mold is duplicated using the master template, and then the wire grid polarizer may be mass-produced using the duplicated imprint mold.

The foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIGS. 7A, 7B, and 7C are plan views illustrating an imprint lithography method for a substrate having 4×4 area according to an exemplary embodiment of the inventive concept.

DETAILED DESCRIPTION OF THE ILLUSTRATED EMBODIMENTS

Figure 1A:
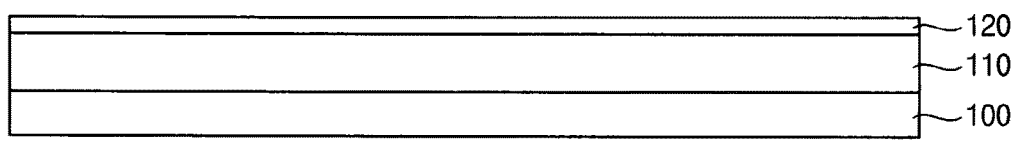
FIGS. 1A, 1B, 1C, 1D, 1E, 1F, 1G, 1H, 1I, 1J, 1K, 1L, 1M, and 1N are cross-sectional views illustrating an imprint lithography method according to an exemplary embodiment of the inventive concept.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIGS. 1A, 1B, 1C, 1D, 1E, 1F, 1G, 1H, 1I, 1J, 1K, 1L, 1M, and 1N are cross-sectional views illustrating an imprint lithography method according to an exemplary embodiment of the inventive concept.

Referring to FIG. 1A, a first layer 110 may be formed on a base substrate 100. The base substrate 100 may include a material which has relatively high transmittance, thermal resistance, and chemical resistance. For example, the base substrate 100 may include a glass substrate, a quartz substrate, a transparent resin substrate, etc. Examples of the transparent resin substrate for the base substrate 100 may include polyimide-based resin, acryl-based resin, polyacrylate-based resin, polycarbonate-based resin, polyether-based resin, sulfonic acid containing resin, polyethyleneterephthalate-based resin, etc.

The first layer 110 may include a metal. For example, the first layer 110 may include aluminum (Al), titanium (Ti), copper (Cu), indium tin oxide (ITO), indium zinc oxide (IZO), etc. These may be used alone or in a mixture thereof. In some exemplary embodiments, the first layer 110 may include an inorganic material, such as silicon oxide ($SiO_x$), silicon nitride ($SiN_x$), etc.

The first layer 110 may be obtained by a sputtering process, a spin coating process, a chemical vapor deposition (CVD) process, a plasma enhanced chemical vapor deposition (PECVD) process, a high density plasma-chemical vapor deposition (HDP-CVD) process, a printing process, etc.

A mask layer 120 may be formed on the first layer 110. The mask layer 120 may include a material having an etch rate lower than that of the first layer 110. For example, when the first layer 110 includes silicon oxide (SiOx), the mask layer 120 may be a metal layer, such as aluminum. In contrast, when the first layer 110 includes aluminum, the mask layer 120 may include silicon oxide (SiOx).

Figure 1B:
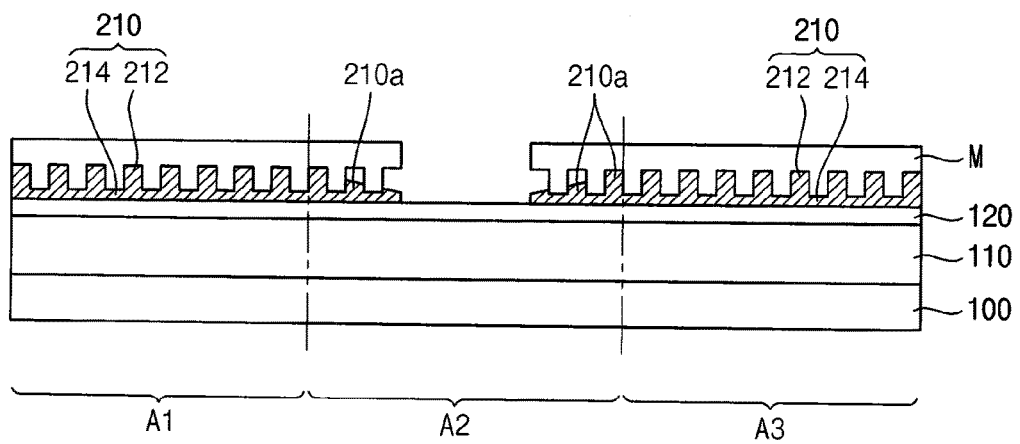

Referring to FIG. 1B, the base substrate 100 includes a first area A1, a second area A2 and a third area A3. The third area A3 may be spaced apart from the first area A1. The second area A2 may be disposed between the first area A1 and the third area A3.

A first preliminary pattern 210 may be formed on the mask layer 120 in the first area A1. A first resin solution may be provided on the mask layer 120 in the first area A1. In an exemplary embodiment, the first resin solution may be provided in the first area A1 and a portion which is adjacent to the first area A1. The first resin solution may be provided by using droplets on the mask layer 120. For example, the first resin solution may be dropped on the mask layer 120 by an inkjet method. The first resin solution may be an ultraviolet ray-curable resin composition having a relatively low viscosity.

The first preliminary pattern 210 may be formed by pressing an imprint mold M on the first resin solution. Accordingly, a first imprint process may be performed. The first resin solution may have a low viscosity, so that the first preliminary pattern 210 between the imprint mold M and the base substrate 100 may be formed by the capillarity of the first resin.

The imprint mold M having a mold pattern may include transparent material which passes ultraviolet rays. The mold pattern may mirror the shape of the first preliminary pattern 210. For example, the mold pattern may include a protrusion pattern having the same shapes and formed in uniform distances to form the first preliminary pattern 210 which corresponds to a wire grid pattern. The protrusion pattern may have a pitch of about 50 nm (nanometer) to 150 nm. The pitch may be defined as sum of the width of one of the protrusion pattern and a distance between protrusions disposed next to each other.

The first resin solution is disposed in the first area A1, so that the first preliminary pattern 210 may be formed in the first area A1. During the first imprint process, a portion of the first resin solution may be overflowed outside of the first area A1, so that a first overflowed portion 210a may be formed.

The first preliminary pattern 210 may include a residual layer 214 formed on the mask layer 120, and a plurality of protrusions 212 on the residual layer 214. Each of the protrusions 212 of the first preliminary pattern 210 may be located between the protrusion patterns of the mold pattern of the imprint mold M.

Ultraviolet rays may then be irradiated on the first preliminary pattern 210, so that resin solution of the first preliminary pattern 210 may be hardened. The imprint mold M may pass the ultraviolet ray, so that the ultraviolet rays may reach the first preliminary pattern 210 through the imprint mold M. Thus, the resin solution of the first preliminary pattern 210 may be hardened. The first preliminary pattern 210 may then be formed by separating the imprint mold M from the base substrate 100.

In a similar way, a first preliminary pattern 210a in the third area A3 and a first overflowed portion 220a out of the first area A3 may be formed on mask layer 120. Here, the first preliminary pattern 210 in the first area A1 and the first preliminary pattern 210 in the third area A3 may be formed sequentially or simultaneously.

Accordingly, the first preliminary pattern 210 in the first and third areas A1 and A3, and the first overflowed portion 210a in the second area A2, may be formed by the imprint mold M. The first overflowed portion 210a may have a normal pattern and an uneven pattern.

Figure 1C:
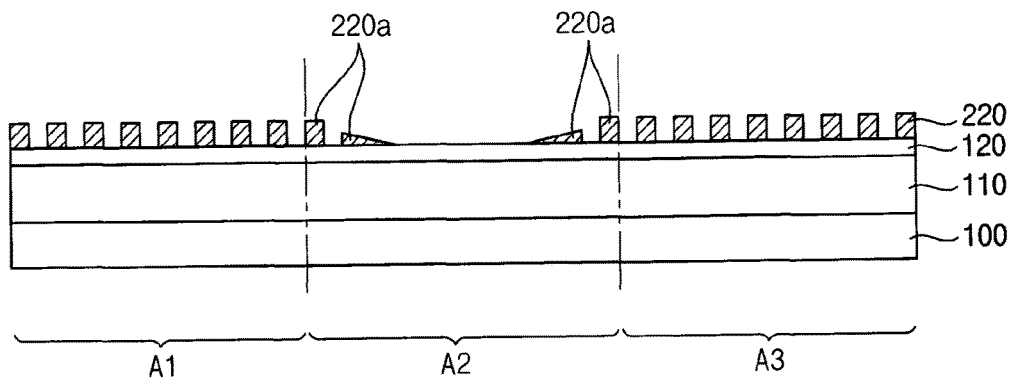

Referring to FIGS. 1B and 1C, the residual layer 214 of the first preliminary pattern 210 is removed to form a first imprint pattern 220. The first imprint pattern 220 may be formed in the first area A1 and the third area A3. The first imprint pattern 220 may be formed by etching the first preliminary pattern 210 to remove the residual layer between the protrusions. Here, the first overflowed portion 210a may be partially removed, so that a first residual-overflowed portion 220a may be formed.

Figure 1D:
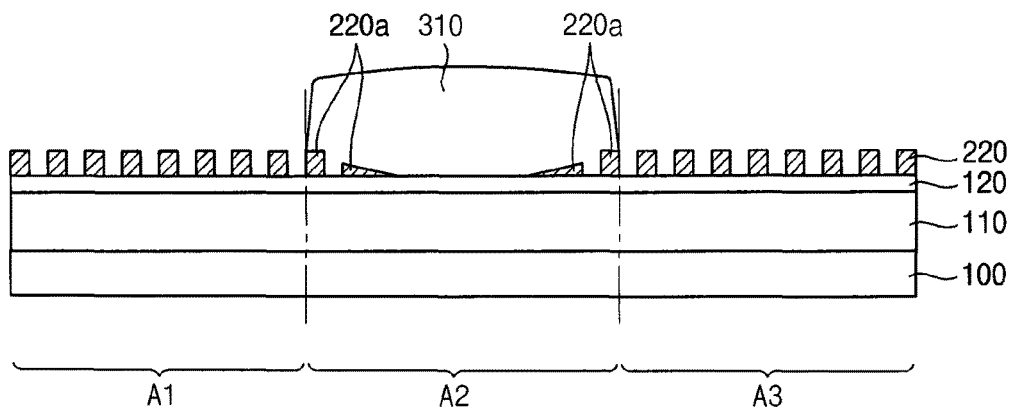

Referring to FIG. 1D, a first resist pattern 310 may be formed in the second area A2 on the mask layer 120 on which the first imprint pattern 220 is formed. The first resist pattern 310 may cover the first residual-overflowed portion 220a in the second area A2.

A photoresist layer may be formed on the mask layer 120 on which the first imprint pattern 220 is formed. And then, the first resist pattern 310 may be formed by exposure and development of the photoresist layer using an additional mask configured to remain in a portion of the photoresist layer which corresponds to the second area A2.

Figure 1E:
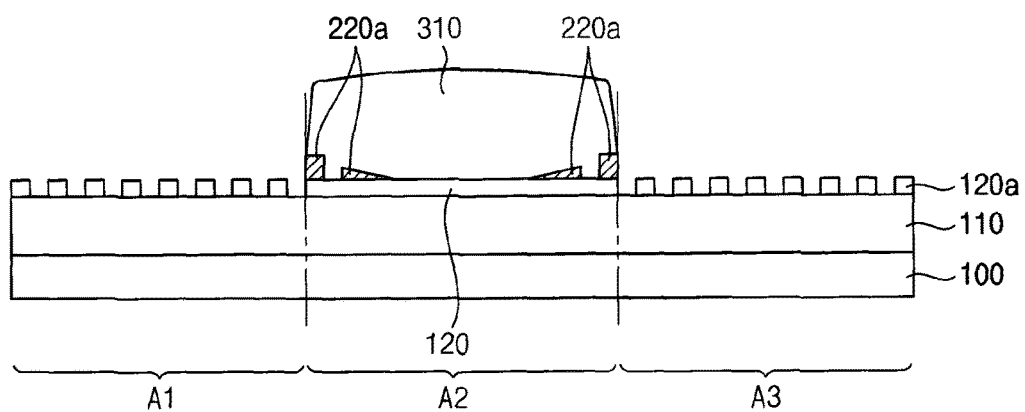

Referring to FIGS. 1D and 1E, the mask layer 120 may be partially removed using the first imprint pattern 220 and the first resist pattern 310 as a mask. Accordingly, a mask pattern 120a may be formed in the first area A1 and the third area A3. For example, the mask layer 120 may be dry etched using the first imprint pattern 220 and the first resist pattern 310 as an etch barrier. Here, the first resist pattern 310 covers the second area A2, so that a portion of the mask layer 120 which corresponds to the second area A2 may remain, and the mask layer 120 in the first and third area A1 and A3 may be patterned into the mask pattern 120a.

Then, the first imprint pattern 220 which remains in the first and third area A1 and A3 may be removed.

Figure 1F:
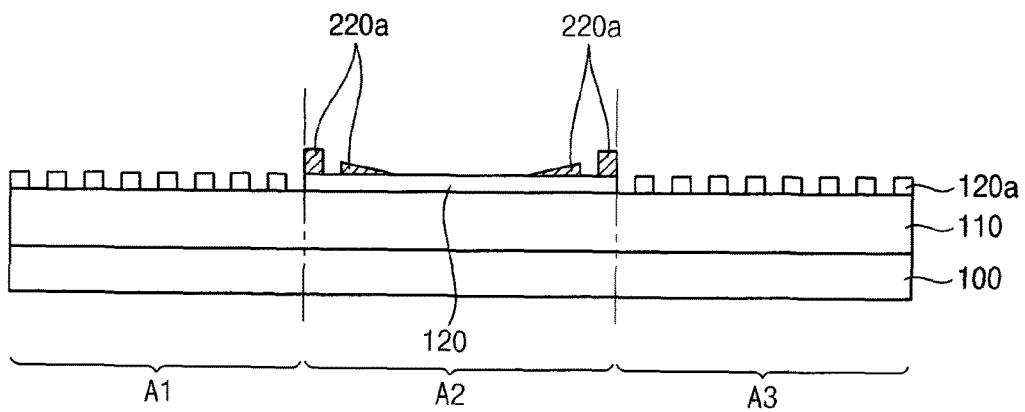

Referring to FIGS. 1E and 1F, the first resist pattern 310 may be removed. For example, a stripping composition may be provided on the first resist pattern 310, so that the first resist pattern 310 may be stripped.

Figure 1G:
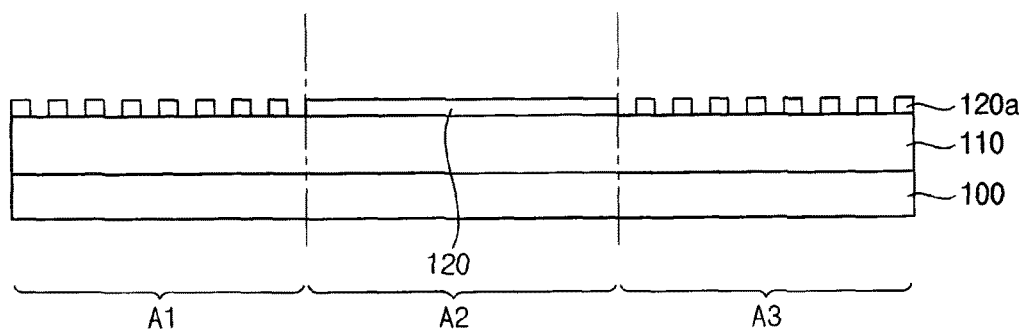

Referring to FIGS. 1F and 1G, the first residual-overflowed portion 220a may be removed. For example, the first residual-overflowed portion 220a may be removed by ashing process using ashing gas. Accordingly, the mask layer 120 in the second area A2 may be exposed.

Figure 1H:
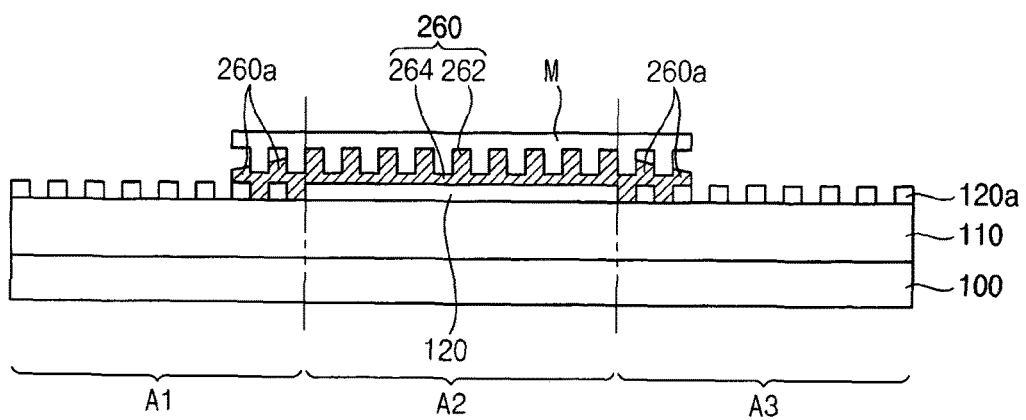

Referring to FIG. 1H, a second preliminary pattern 260 may be formed on the mask layer 120 in the second area A2.

A second resin solution may be provided on the mask layer 120 in the second area A2. In some exemplary embodiment, the second resin solution may be provided in the second area A2 and a portion which is adjacent to the second area A2. The second resin solution may be provided with droplet on the mask layer 120. For example, the second resin solution may be dropped on the mask layer 120 by inkjet method. The second resin solution may be an ultraviolet ray curable resin composition having a relatively low viscosity.

The second preliminary pattern 260 may be formed by pressing the imprint mold M on the second resin solution. Accordingly, a second imprint process may be performed. The second resin solution may have low viscosity, so that the second preliminary pattern 260 between the imprint mold M and the base substrate 100 may be formed by the capillarity of the second resin.

The imprint mold M and the imprint mold of FIG. 1B may be same.

The second resin solution is disposed in the second area A2, so that the second preliminary pattern 260 may be formed in the second area A2. During the second imprint process, a portion of the second resin solution may be overflowed outside of the second area A2, so that a second overflowed portion 260a may be formed.

The second preliminary pattern 260 may include a residual layer 264 formed on the mask layer 120, and a plurality of protrusions 262 on the residual layer 264. Each of the protrusions 262 of the second preliminary pattern 260 may be located between the protrusion patterns of the mold pattern of the imprint mold M.

Then, ultraviolet rays may be irradiated to the second preliminary pattern 260, so that resin solution of the second preliminary pattern 260 may be hardened. The imprint mold M may pass the ultraviolet ray, so that the ultraviolet rays may reach to the second preliminary pattern 260 through the imprint mold M. Thus, the resin solution of the second preliminary pattern 260 may be hardened. And then, the second preliminary pattern 260 may be formed by separating the imprint mold M from the base substrate 100.

Accordingly, the second preliminary pattern 260 in the second area A2, and the second overflowed portion 260a in the first and third areas A1 and A3 may be formed by the imprint mold M. The second overflowed portion 260a may have a normal pattern and an uneven pattern.

Figure 1I:
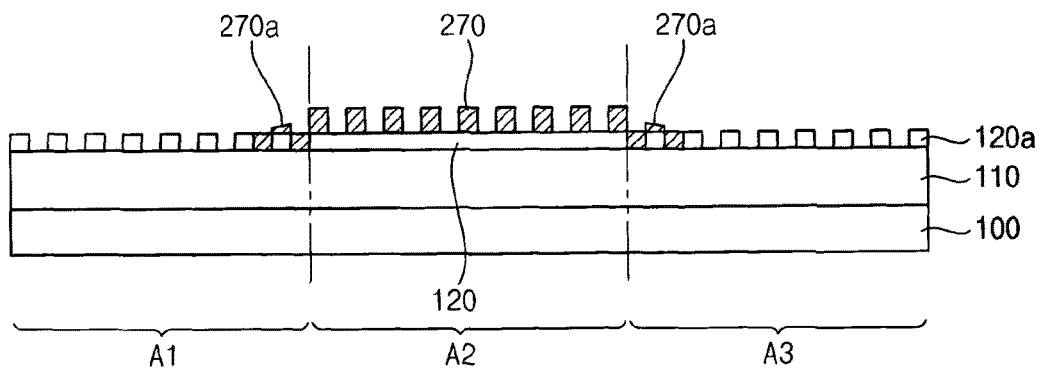

Referring to FIGS. 1H and 1I, the residual layer 264 of the second preliminary pattern 260 is removed to form a second imprint pattern 270. The second imprint pattern 270 may be formed in the second area A2. The second imprint pattern 270 may be formed by overall etching the second preliminary pattern 260 to remove the residual layer 264 between the protrusions. Here, the second overflowed portion 260a may be partially removed, so that a second residual-overflowed portion 270a may be formed.

Figure 1J:
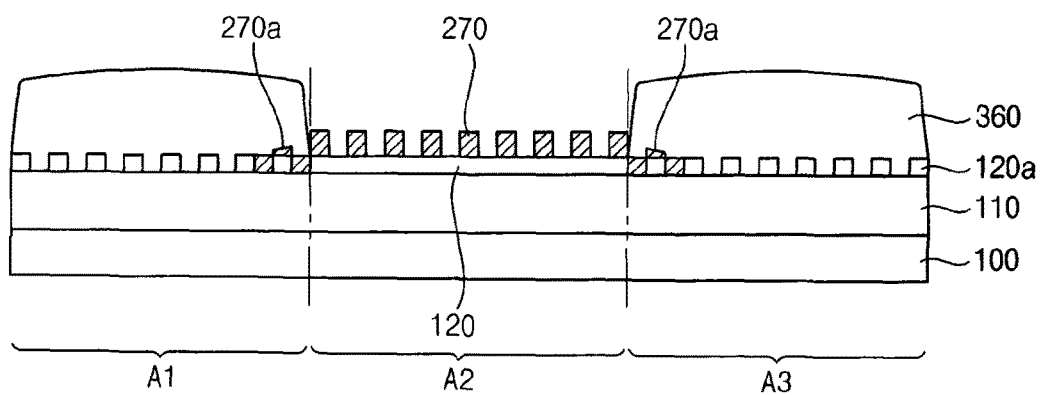

Referring to FIG. 1J, a second resist pattern 360 may be formed in the first and third areas A1 and A3 on the mask layer 120 on which the second imprint pattern 270 is formed. The second resist pattern 360 may cover the second residual-overflowed portion 270a in the first and third areas A1 and A3.

A photoresist layer may be formed on the mask layer 120 on which the second imprint pattern 270 is formed. And then, the second resist pattern 360 may be formed by exposure and development of the photoresist layer using an additional mask configured to remain in a portion of the photoresist layer which corresponds to the first and third areas A1 and A3.

Figure 1K:
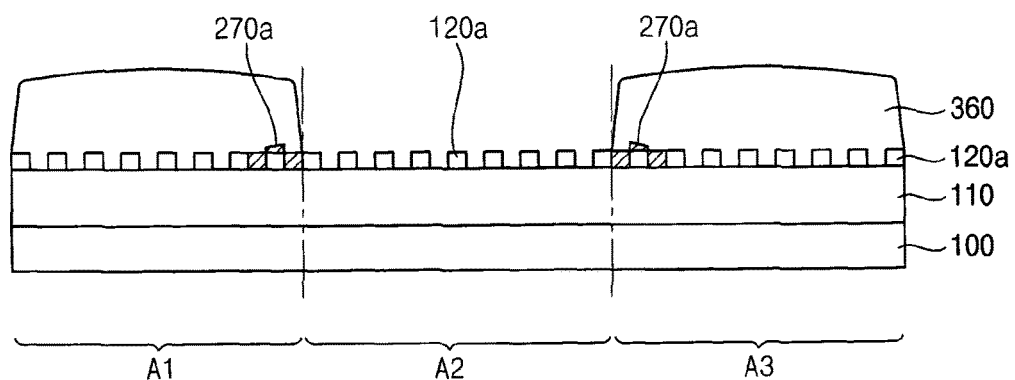

Referring to FIGS. 1J and 1K, the mask layer 120 may be partially removed using the second imprint pattern 270 and the second resist pattern 360 as a mask. Accordingly, a mask pattern 120a may be formed in the second area A2. For example, the mask layer 120 may be dry etched using the second imprint pattern 270 and the second resist pattern 360 as an etch barrier. Here, the second resist pattern 360 covers the first and third areas A1 and A3, so that a portion of the mask layer 120 which corresponds to the first and third areas A1 and A3 may remain, and the mask layer 120 in the second area A2 may be patterned into the mask pattern 120a.

Then, the second imprint pattern 270 which remains in the second area A2 may be removed.

Figure 1L:
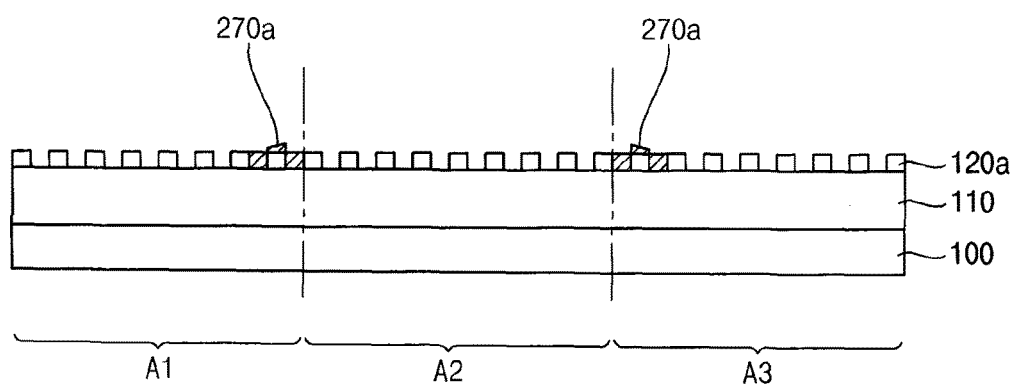

Referring to FIGS. 1K and 1L, the second resist pattern 360 may be removed. For example, a stripping composition may be provided on the second resist pattern 360, so that the second resist pattern 360 may be stripped.

Figure 1M:
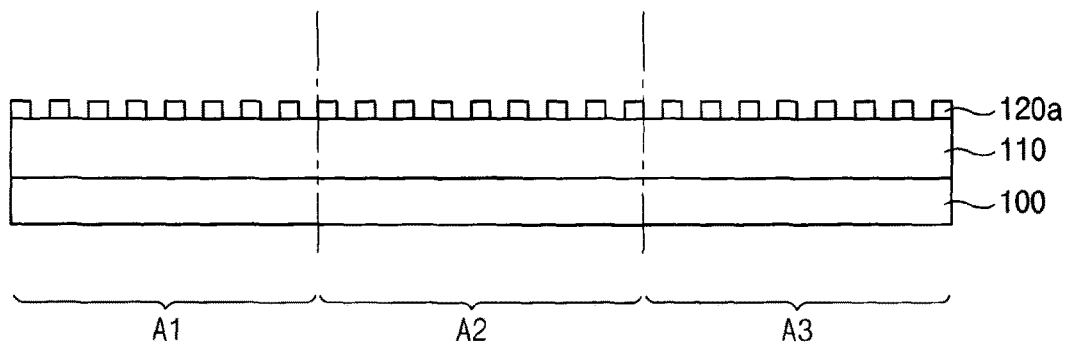

Referring to FIGS. 1L and 1M, the second residual-overflowed portion 270a may be removed. For example, the second residual-overflowed portion 270a may be removed by an ashing process using ashing gas.

Accordingly, the mask pattern 120a may be formed in the first to third areas A1, A2, and A3.

Figure 1N:
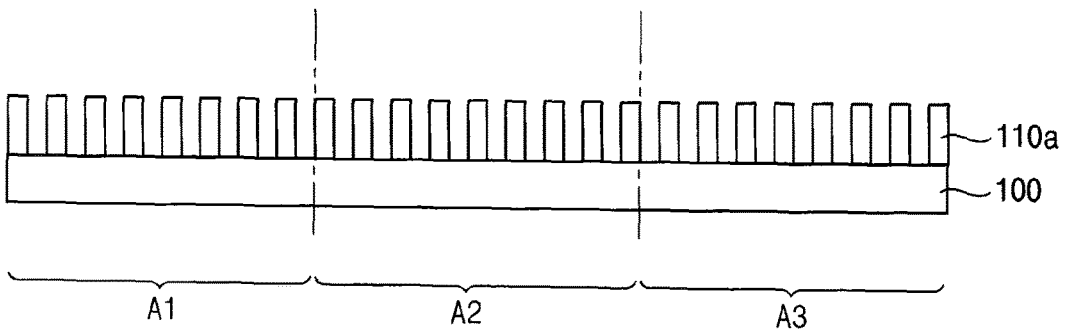

Referring to FIGS. 1M and 1N, the first layer 110 may be partially removed using the mask pattern 120a as a mask. For example, the first layer 110 may be dry-etched using the mask pattern 120a as an etch barrier.

Accordingly, a substrate having the base substrate 100 and a first layer pattern 110a on the base substrate 100 may be formed.

A master template for large area process and a wire grid polarizer may be manufactured by the imprint lithography method of the present embodiment. For example, the master template for imprint may be formed by the method, and then an imprint mold is duplicated using the master template, and then the wire grid polarizer may be mass-produced using the duplicated imprint mold.

FIGS. 2A, 2B, 2C, 2D, 2E, 2F, 2G, 2H, 2I, 2J, 2K, 2L, and 2M are cross-sectional views illustrating an imprint lithography method according to an exemplary embodiment of the inventive concept. The imprint lithography method is substantially same as the imprint lithography method of FIGS. 1A, 1B, 1C, 1D, 1E, 1F, 1G, 1H, 1I, 1J, 1K, 1L, 1M, and 1N, except for existence of a mask layer. Thus, any further detailed descriptions concerning the same elements will be omitted or briefly described.

Figure 2A:
FIGS. 2A, 2B, 2C, 2D, 2E, 2F, 2G, 2H, 2I, 2J, 2K, 2L, and 2M are cross-sectional views illustrating an imprint lithography method according to an exemplary embodiment of the inventive concept.

Referring to FIG. 2A, a first layer 110 may be formed on a base substrate 100.

The first layer 110 may include a metal. In some exemplary embodiment, the first layer 110 may include an inorganic material such as silicon oxide ($SiO_x$), silicon nitride ($SiN_x$), and etc.

Figure 2B:
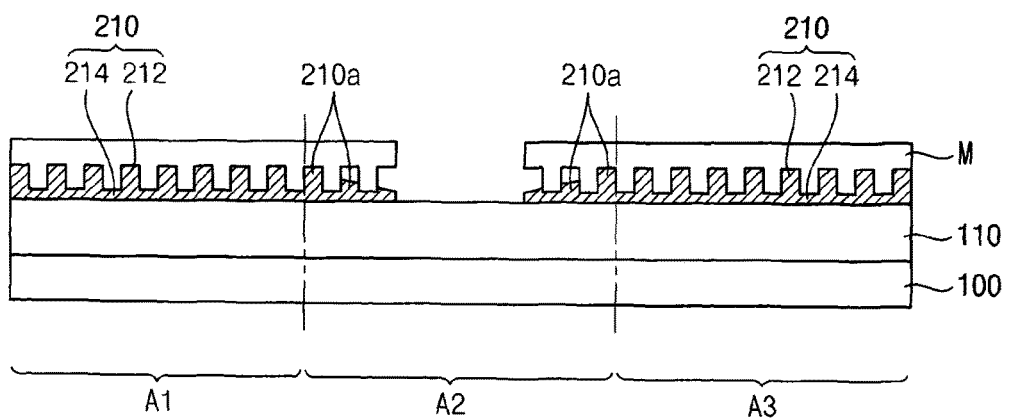

Referring to FIG. 2B, the base substrate 100 includes a first area A1, a second area A2 and a third area A3. The third area A3 may be spaced apart from the first area A1. The second area A2 may be disposed between the first area A1 and the third area A3.

A first preliminary pattern 210 may be formed on the first layer 110 in the first area A1.

A first resin solution may be provided on the first layer 110 in the first area A1. In some exemplary embodiment, the first resin solution may be provided in the first area A1 and a portion which is adjacent to the first area A1. The first resin solution may be provided with droplet on the first layer 110.

The first preliminary pattern 210 may be formed by pressing an imprint mold M on the first resin solution. Accordingly, a first imprint process may be performed.

The first resin solution may be disposed in the first area A1, so that the first preliminary pattern 210 may be formed in the first area A1. During the first imprint process, a portion of the first resin solution may be overflowed outside of the first area A1, so that a first overflowed portion 210a may be formed.

The first preliminary pattern 210 may include a residual layer 214 formed on the mask layer 120, and a plurality of protrusions 212 on the residual layer 214.

Then, ultraviolet rays may be irradiated to the first preliminary pattern 210, so that resin solution of the first preliminary pattern 210 may be hardened.

In a similar way, a first preliminary pattern 210a in the third area A3 and a first overflowed portion 210a out of the first area A3 may be formed on the first layer 110. Here, the first preliminary pattern 210 in the first area A1 and the first preliminary pattern 210 in the third area A3 may be formed sequentially or simultaneously.

Accordingly, the first preliminary pattern 210 in the first and third areas A1 and A3, and the first overflowed portion 210a in the second area A2 may be formed by the imprint mold M.

Figure 2C:
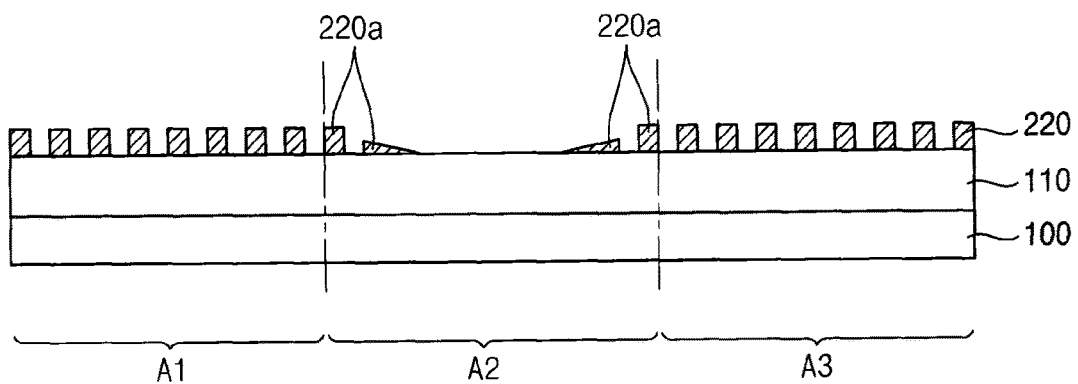

Referring to FIGS. 2B and 2C, the residual layer 214 of the first preliminary pattern 210 is removed to form a first imprint pattern 220. The first imprint pattern 220 may be formed in the first area A1 and the third area A3. Here, the first overflowed portion 210a may be partially removed, so that a first residual-overflowed portion 220a may be formed.

Figure 2D:
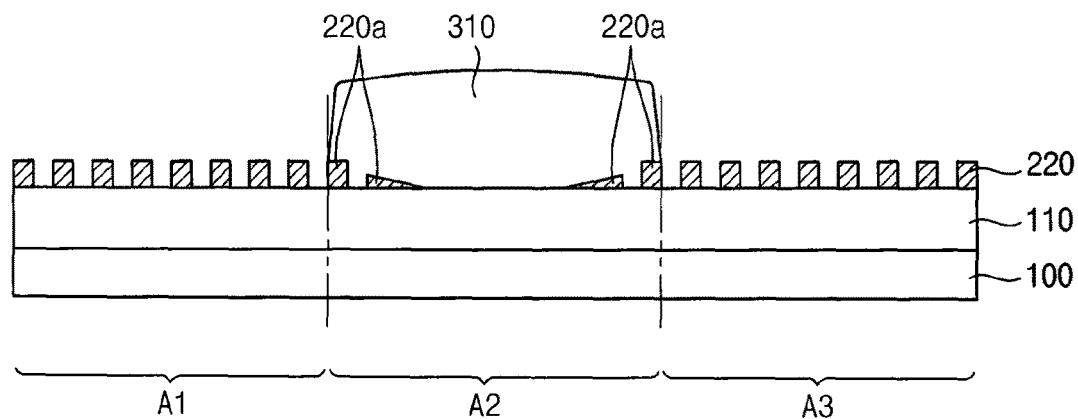

Referring to FIG. 2D, a first resist pattern 310 may be formed in the second area A2 on the first layer 110 on which the first imprint pattern 220 is formed. The first resist pattern 310 may cover the first residual-overflowed portion 220a in the second area A2.

A photoresist layer may be formed on the first layer 110 on which the first imprint pattern 220 is formed. And then, the first resist pattern 310 may be formed by exposure and development of the photoresist layer using an additional mask configured to remain in a portion of the photoresist layer which corresponds to the second area A2.

Figure 2E:
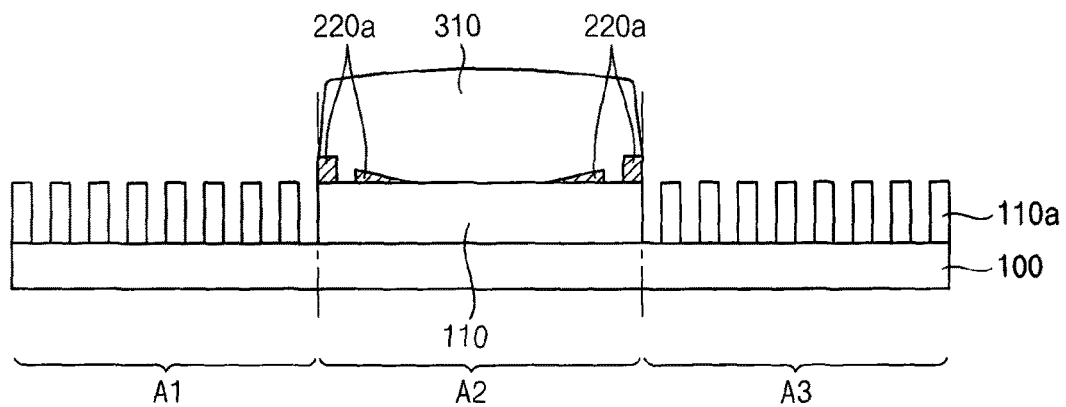

Referring to FIGS. 2D and 2E, the first layer 110 may be partially removed using the first imprint pattern 220 and the first resist pattern 310 as a mask. Accordingly, a first layer pattern 110a may be formed in the first area A1 and third area A3.

Then, the first imprint pattern 220 which remains in the first and third area A1 and A3 may be removed.

Figure 2F:
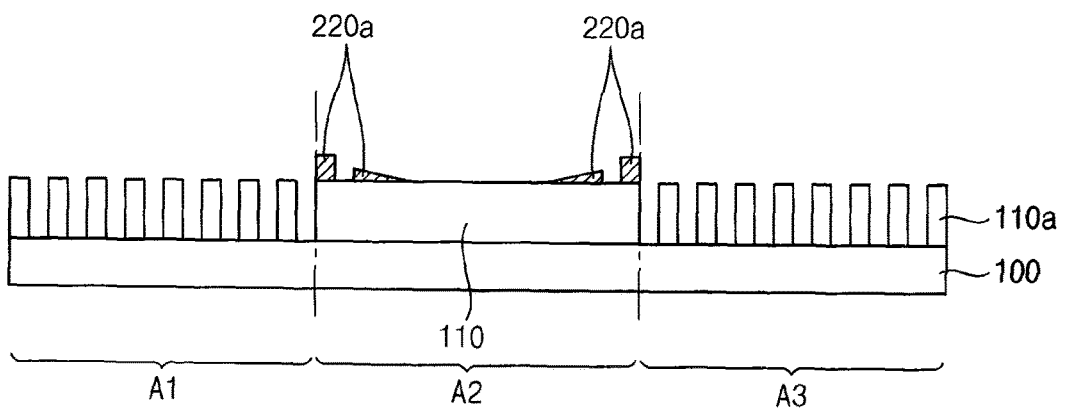

Referring to FIGS. 2E and 2F, the first resist pattern 310 may be removed.

Figure 2G:
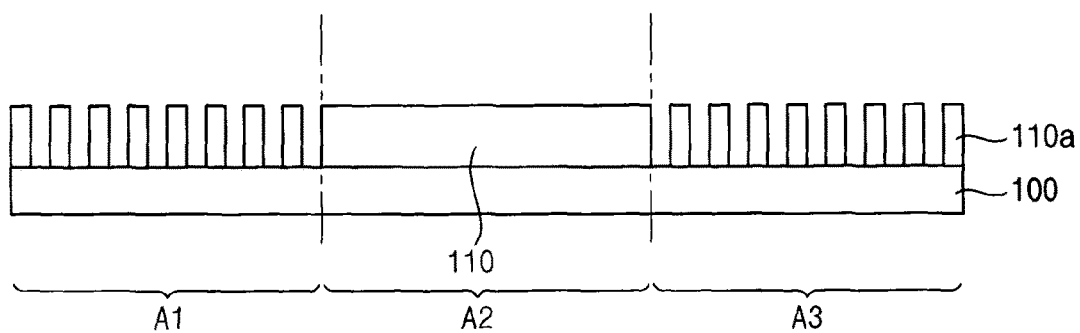

Referring to FIGS. 2F and 2G, the first residual-overflowed portion 220a may be removed.

Figure 2H:
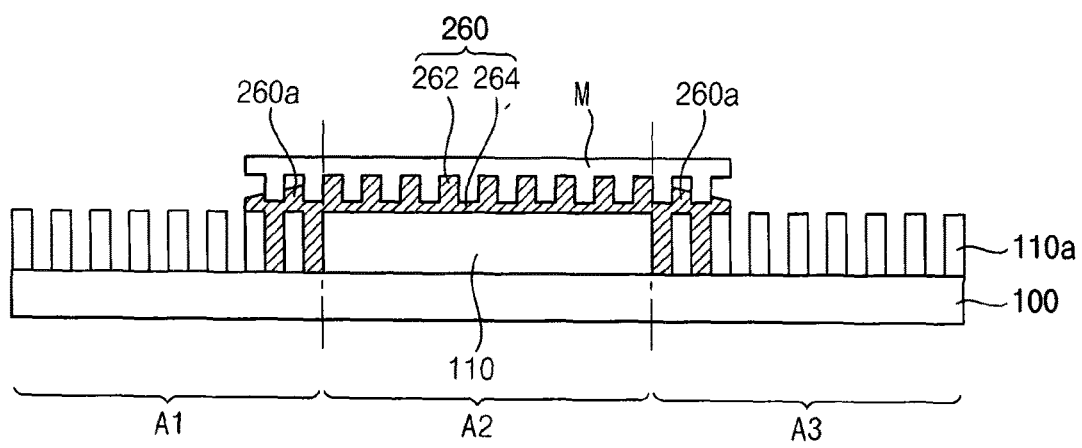

Referring to FIG. 2H, a second preliminary pattern 260 may be formed on the first layer 110 in the second area A2.

A second resin solution may be provided on the first layer 110 in the second area A2. In some exemplary embodiment, the second resin solution may be provided in the second area A2 and a portion which is adjacent to the second area A2.

The second preliminary pattern 260 may be formed by pressing the imprint mold M on the second resin solution. Accordingly, a second imprint process may be performed.

The imprint mold M and the imprint mold of FIG. 2B may be same.

The second resin solution is disposed in the second area A2, so that the second preliminary pattern 260 may be formed in the second area A2. During the second imprint process, a portion of the second resin solution may be overflowed outside of the second area A2, so that a second overflowed portion 260a may be formed.

The second preliminary pattern 260 may include a residual layer 264 formed on the first layer 110, and a plurality of protrusions 262 on the residual layer 264.

Then, the ultraviolet rays may be irradiated to the second preliminary pattern 260, so that resin solution of the second preliminary pattern 260 may be hardened.

Accordingly, the second preliminary pattern 260 in the second area A2, and the second overflowed portion 260a in the first and third areas A1 and A3 may be formed by the imprint mold M.

Figure 2I:
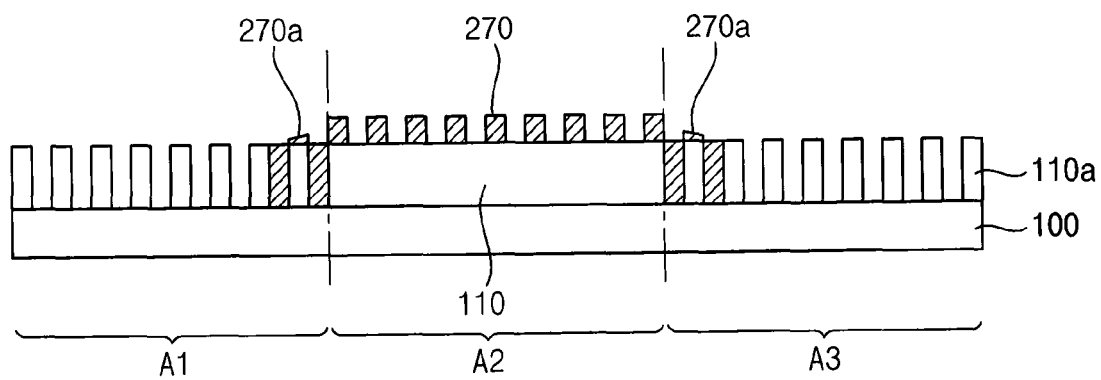

Referring to FIGS. 2H and 2I, the residual layer 264 of the second preliminary pattern 260 is removed to form a second imprint pattern 270. The second imprint pattern 270 may be formed in the second area A2.

Figure 2J:
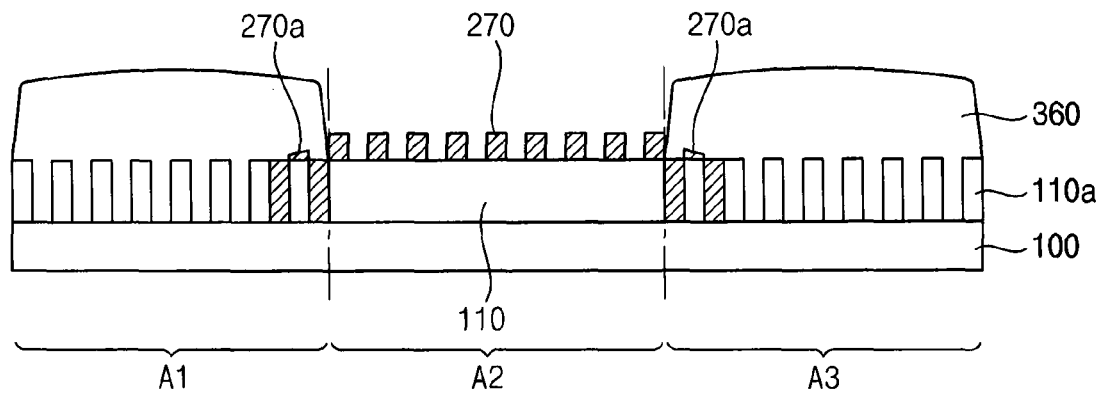

Referring to FIG. 2J, a second resist pattern 360 may be formed in the first and third areas A1 and A3 on the first layer pattern 110a. The second resist pattern 360 may cover the second residual-overflowed portion 270a in the first and third areas A1 and A3.

Figure 2K:
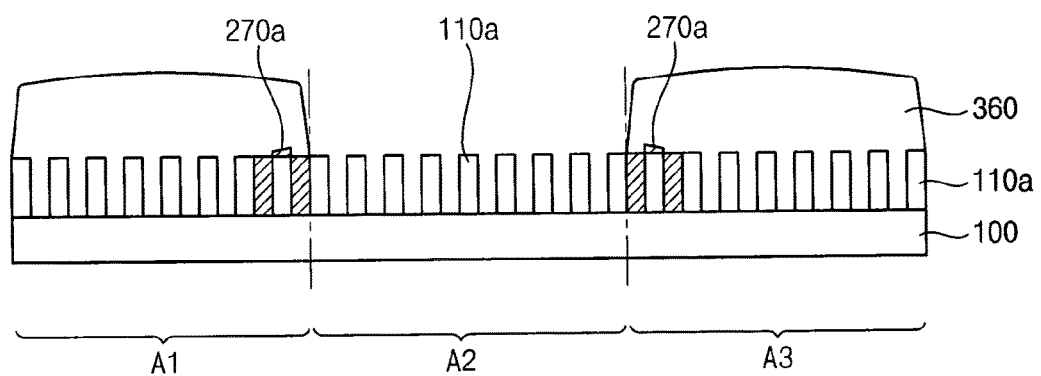

Referring to FIGS. 2J and 2K, the first layer 110 may be partially removed using the second imprint pattern 270 and the second resist pattern 360 as a mask. Accordingly, the first layer pattern 110a may be formed in the second area A2.

Then, the second imprint pattern 270 which remains in the second area A2 may be removed.

Figure 2L:
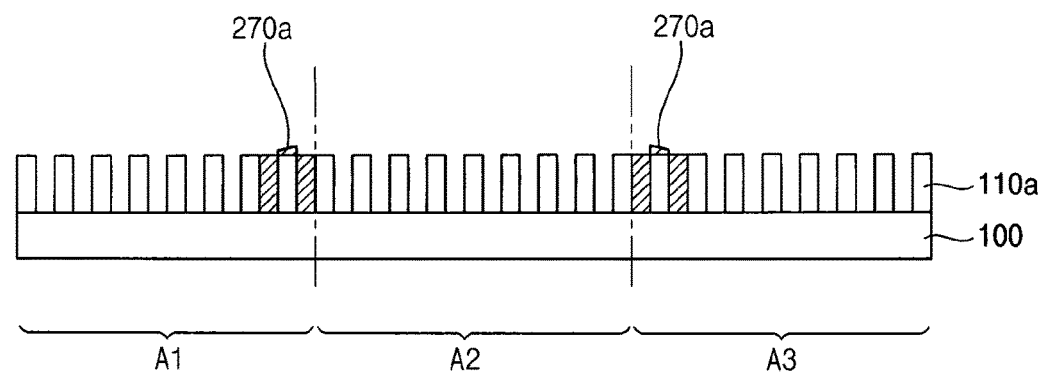

Referring to FIGS. 2K and 2L, the second resist pattern 360 may be removed.

Figure 2M:
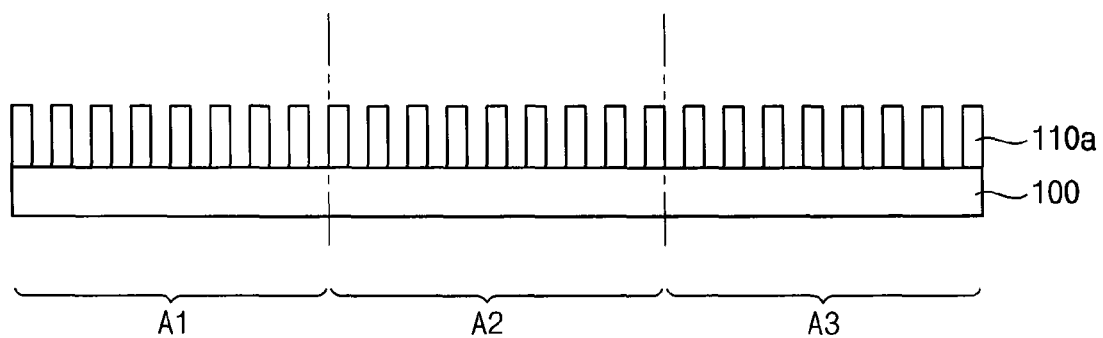

Referring to FIGS. 2L and 2M, the second residual-overflowed portion 270a may be removed.

Accordingly, a substrate having the base substrate 100 and a first layer pattern 110a on the base substrate 100 may be formed.

A master template for large area process and a wire grid polarizer may be manufactured by the imprint lithography method of the present embodiment. For example, the master template for imprint may be formed by the method, and then an imprint mold is duplicated using the master template, and then the wire grid polarizer may be mass-produced using the duplicated imprint mold.

FIGS. 3A, 3B, 3C, 3D, 3E, 3F, 3G, 3H, 3I, 3J, 3K, 3L, 3M, and 3N are cross-sectional views illustrating an imprint lithography method according to an exemplary embodiment of the inventive concept. The imprint lithography method is substantially same as the imprint lithography method of FIGS. 1A, 1B, 1C, 1D, 1E, 1F, 1G, 1H, 1I, 1J, 1K, 1L, 1M, and 1N, except for removing order of a residual layer of a preliminary pattern. Thus, any further detailed descriptions concerning the same elements will be omitted or briefly described.

Figure 3A:
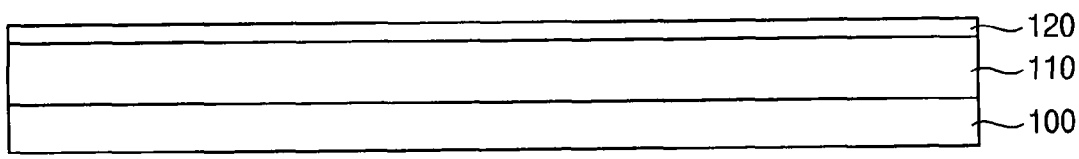
FIGS. 3A, 3B, 3C, 3D, 3E, 3F, 3G, 3H, 3I, 3J, 3K, 3L, 3M, and 3N are cross-sectional views illustrating an imprint lithography method according to an exemplary embodiment of the inventive concept.

Referring to FIG. 3A, a first layer 110 may be formed on a base substrate 100. The first layer 110 may include a metal. In some exemplary embodiment, the first layer 110 may include an inorganic material such as silicon oxide ($SiO_x$), silicon nitride ($SiN_x$), and etc. A mask layer 120 may be formed on the first layer 110. The mask layer 120 may include a material having etch rate lower than that of the first layer 110 in an etching condition of the first layer 110.

Figure 3B:
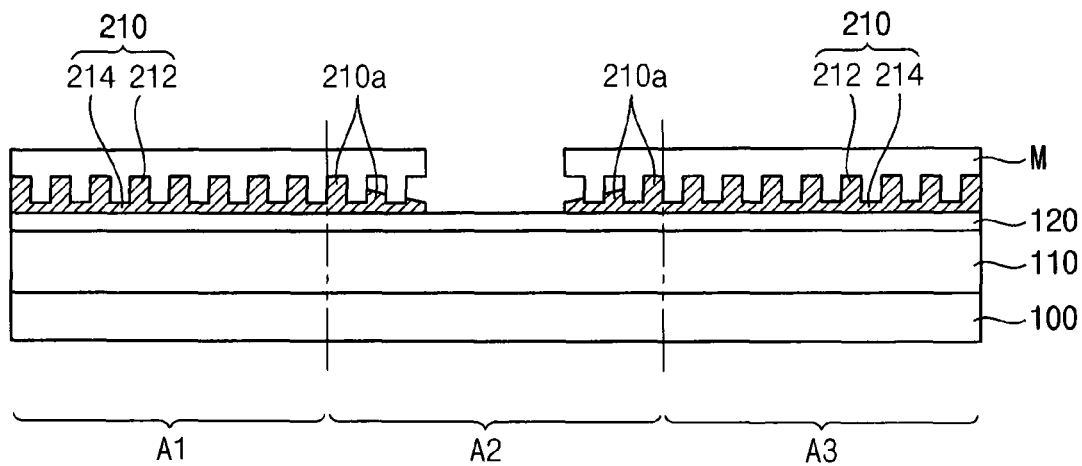

Referring to FIG. 3B, the base substrate 100 includes a first area A1, a second area A2 and a third area A3. The third area A3 may be spaced apart from the first area A1. The second area A2 may be disposed between the first area A1 and the third area A3.

A first preliminary pattern 210 may be formed on the mask layer 120 in the first area A1.

A first resin solution may be provided on the mask layer 120 in the first area A1. In an exemplary embodiment, the first resin solution may be provided in the first area A1 and a portion which is adjacent to the first area A1.

The first preliminary pattern 210 may be formed by pressing an imprint mold M on the first resin solution. Accordingly, a first imprint process may be performed.

The first resin solution may be disposed in the first area A1, so that the first preliminary pattern 210 may be formed in the first area A1. During the first imprint process, a portion of the first resin solution may be overflowed outside of the first area A1, so that a first overflowed portion 210a may be formed.

The first preliminary pattern 210 may include a residual layer 214 formed on the mask layer 120, and a plurality of protrusions 212 on the residual layer 214.

Then, ultraviolet rays may be irradiated to the first preliminary pattern 210, so that resin solution of the first preliminary pattern 210 may be hardened.

In a similar way, a first preliminary pattern 210a in the third area A3 and a first overflowed portion 210a out of the first area A3 may be formed on mask layer 120. Here, the first preliminary pattern 210 in the first area A1 and the first preliminary pattern 210 in the third area A3 may be formed sequentially or simultaneously.

Accordingly, the first preliminary pattern 210 in the first and third areas A1 and A3, and the first overflowed portion 210a in the second area A2 may be formed by the imprint mold M. The first overflowed portion 210a may have a normal pattern and an uneven pattern.

Figure 3C:
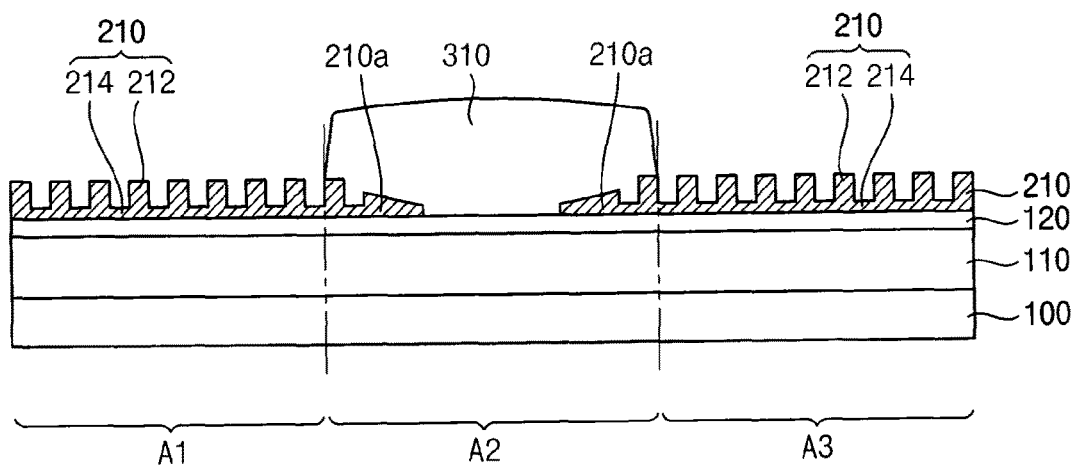

Referring to FIG. 3C, a first resist pattern 310 may be formed in the second area A2 on the mask layer 120 on which the first preliminary pattern 210 is formed. The first resist pattern 310 may overlap the first overflowed portion 210a in the second area A2.

Figure 3D:
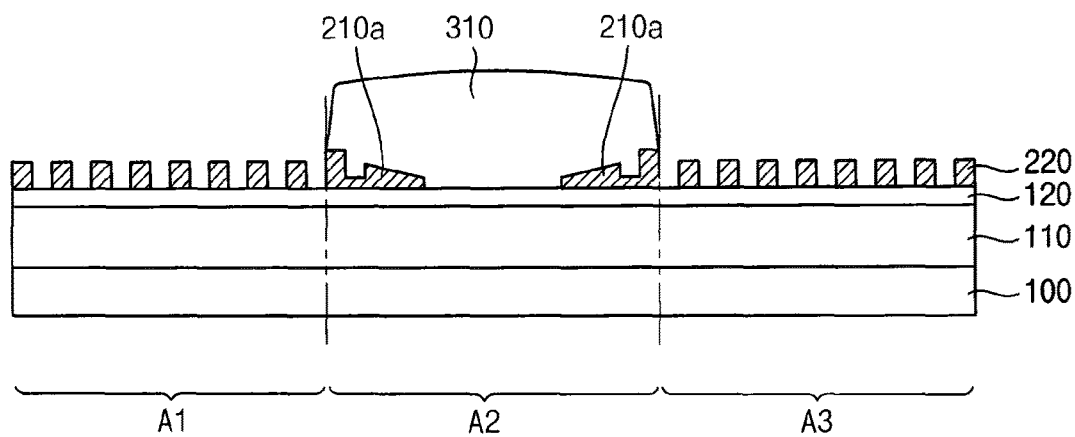

Referring to FIG. 3D, a first imprint pattern 220 may be formed by removing the residual layer 214 of the first preliminary pattern 210. The first imprint pattern 220 may be formed in the first area A1 and the third area A3.

Figure 3E:
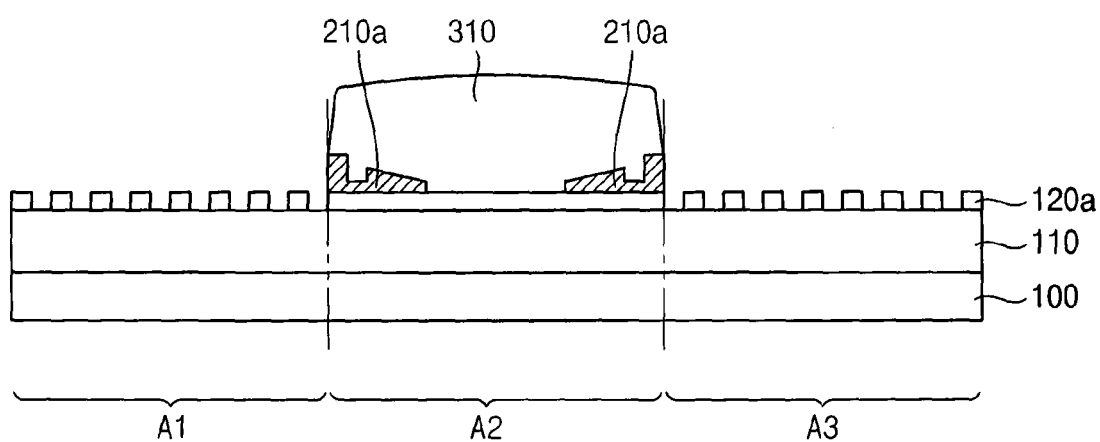

Referring to FIGS. 3D and 3E, the mask layer 120 may be partially removed using the first imprint pattern 220 and the first resist pattern 310 as a mask. Accordingly, a mask pattern 120a may be formed in the first area A1 and the third area A3.

Then, the first imprint pattern 220 which remains in the first and third areas A1 and A3 may be removed.

Figure 3F:
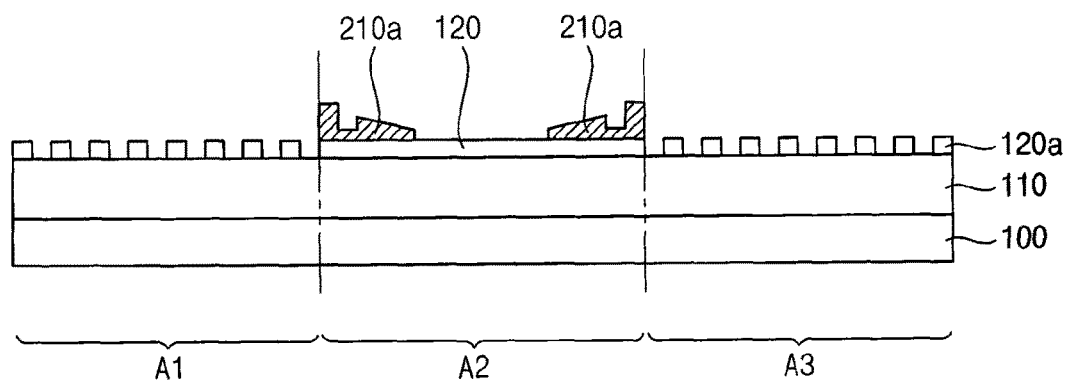

Referring to FIGS. 3E and 3F, the first resist pattern 310 may be removed.

Figure 3G:
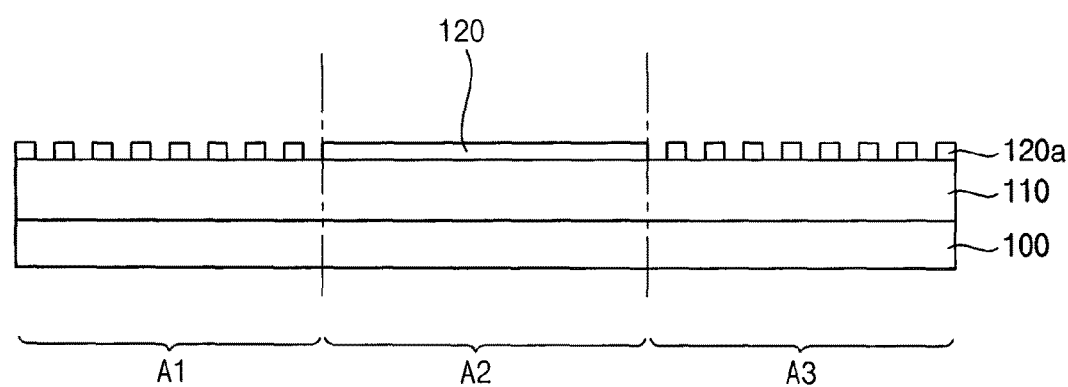

Referring to FIGS. 3F and 3G, the first residual-overflowed portion 210a may be removed.

Referring to FIG. 2H, a second preliminary pattern 260 may be formed on the mask layer 120 in the second area A2.

A second resin solution may be provided on the mask layer 120 in the second area A2. In an exemplary embodiment, the second resin solution may be provided in the second area A2 and a portion which is adjacent to the second area A2.

The second preliminary pattern 260 may be formed by pressing the imprint mold M on the second resin solution. Accordingly, a second imprint process may be performed.

The imprint mold M and the imprint mold of FIG. 3B may be same.

The second resin solution is disposed in the second area A2, so that the second preliminary pattern 260 may be formed in the second area A2. During the second imprint process, a portion of the second resin solution may be overflowed outside of the second area A2, so that a second overflowed portion 260a may be formed.

The second preliminary pattern 260 may include a residual layer 264 formed on the mask layer 120, and a plurality of protrusions 262 on the residual layer 264.

And then, the ultraviolet rays may be irradiated to the second preliminary pattern 260, so that resin solution of the second preliminary pattern 260 may be hardened.

Accordingly, the second preliminary pattern 260 in the second area A2, and the second overflowed portion 260a in the first and third areas A1 and A3 may be formed by the imprint mold M. The second overflowed portion 260a may have a normal pattern and an uneven pattern.

Figure 3H:
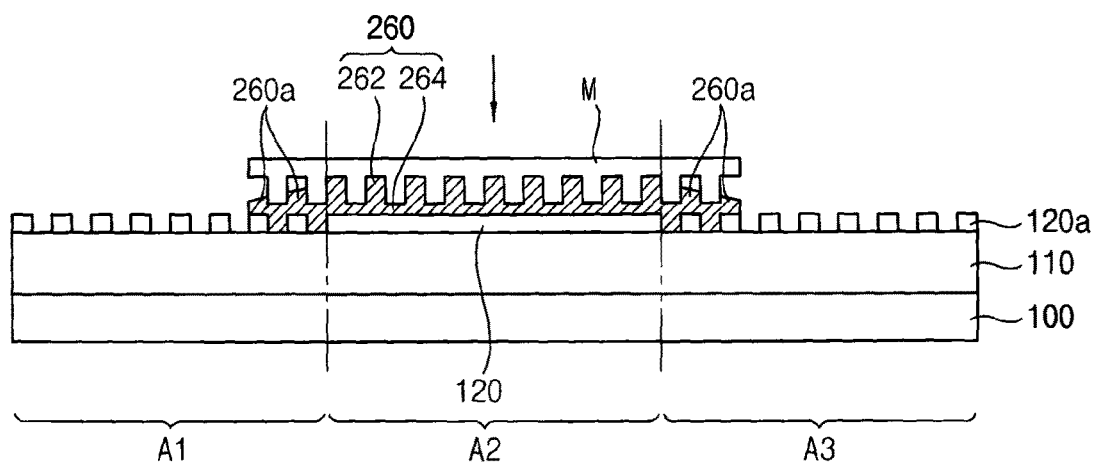
Figure 3I:
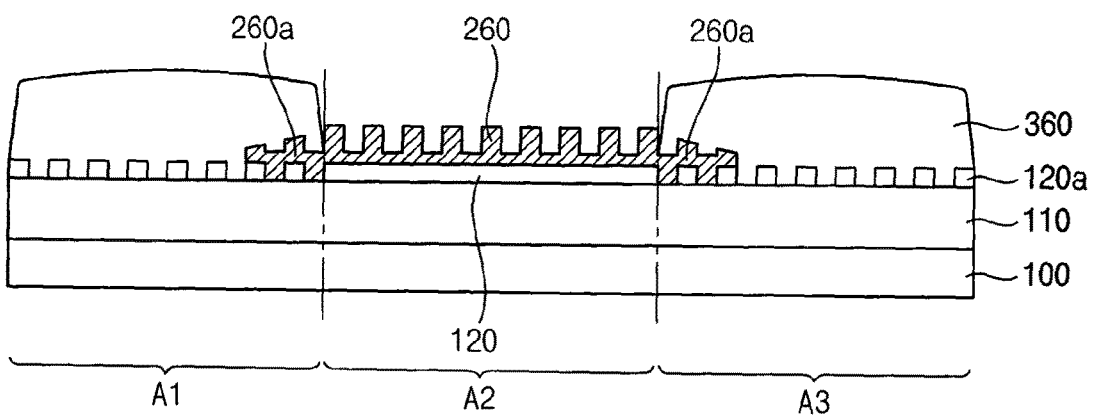

Referring to FIG. 3I, a second resist pattern 360 may be formed in the first and third areas A1 and A3 on the mask pattern 120a. The second resist pattern 360 may cover the second residual-overflowed portion 270a in the first and third areas A1 and A3.

Figure 3J:
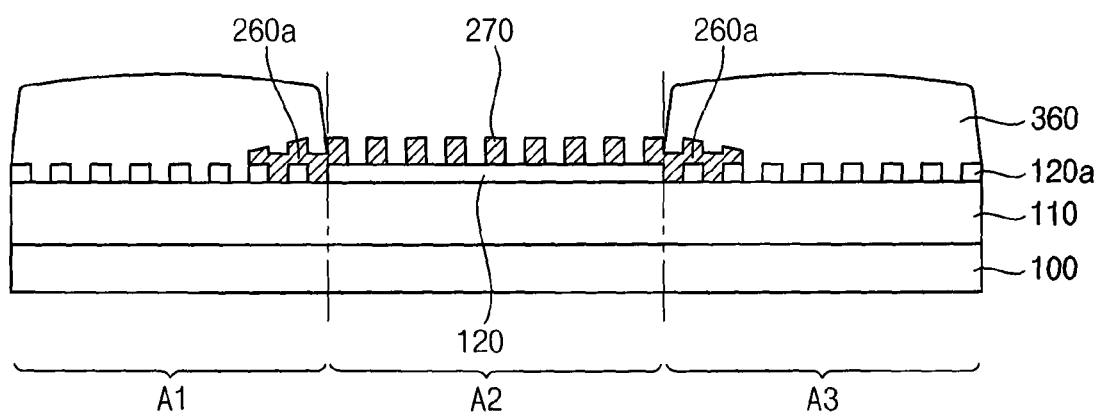

Referring to FIGS. 3H, 3I, and 3J, a second imprint pattern 270 may be formed by removing the residual layer 264 of the second preliminary pattern 260. The second imprint pattern 270 may be formed in the second area A2.

Figure 3K:
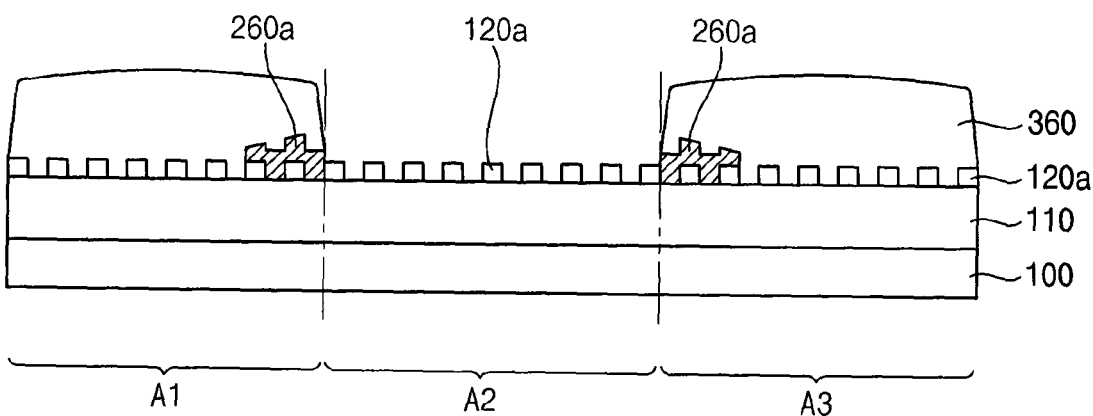

Referring to FIGS. 3J and 3K, the mask layer 120 may be partially removed using the second imprint pattern 270 and the second resist pattern 360 as a mask. Accordingly, a mask pattern 120a may be formed in the second area A2.

Then, the second imprint pattern 270 which remains in the second area A2 may be removed.

Figure 3L:
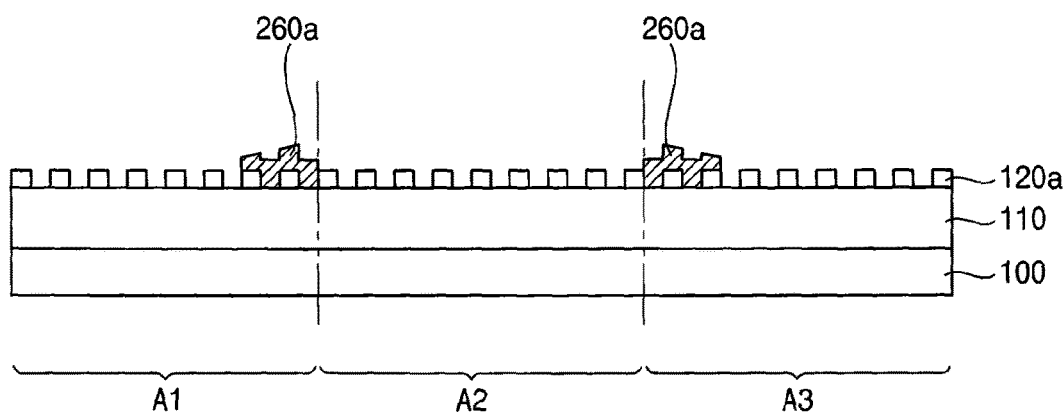

Referring to FIGS. 3K and 3L, the second resist pattern 360 may be removed.

Figure 3M:
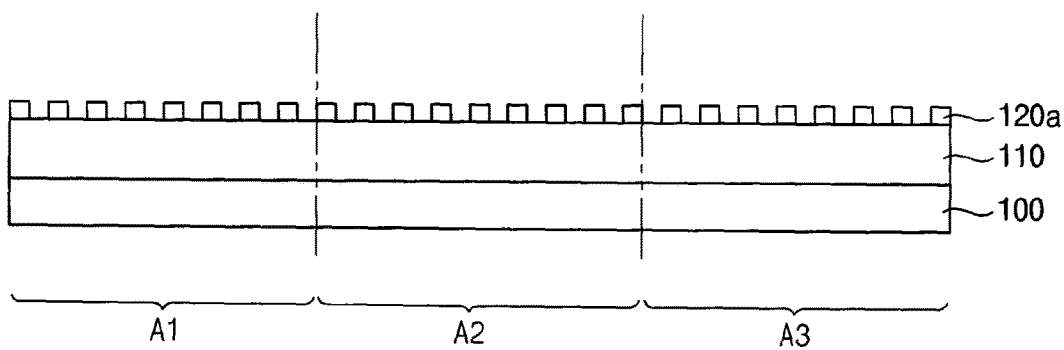

Referring to FIGS. 3L and 3M, the second overflowed portion 260a may be removed.

Accordingly, the mask pattern 120a may be formed in the first to third areas A1, A2, and A3.

Figure 3N:
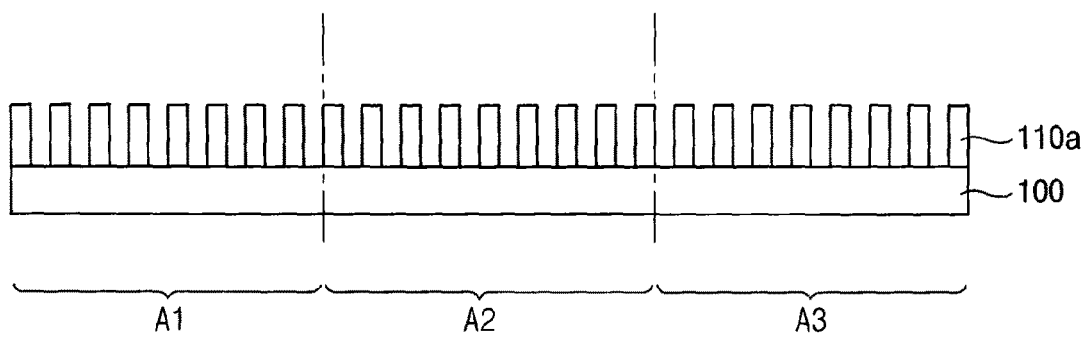

Referring to FIGS. 3M and 3N, the first layer 110 may be partially removed using the mask pattern 120a as a mask.

Accordingly, a substrate having the base substrate 100 and a first layer pattern 110a on the base substrate 100 may be formed.

A master template for large area process and a wire grid polarizer may be manufactured by the imprint lithography method of the present embodiment. For example, the master template for imprint may be formed by the method, and then an imprint mold is duplicated using the master template, and then the wire grid polarizer may be mass-produced using the duplicated imprint mold.

FIGS. 4A, 4B, 4C, 4D, 4E, 4F, 4G, 4H, 4I, 4J, 4K, 4L, 4M, 4N, 4O, 4P, 4Q, 4R, 4S, 4T, 4U, 4V, 4W, and 4X are cross-sectional views illustrating an imprint lithography method according to an exemplary embodiment of the inventive concept. Each of the cross-sectional views is taken along a line I-I' of each of the plan views.

Figure 4A:
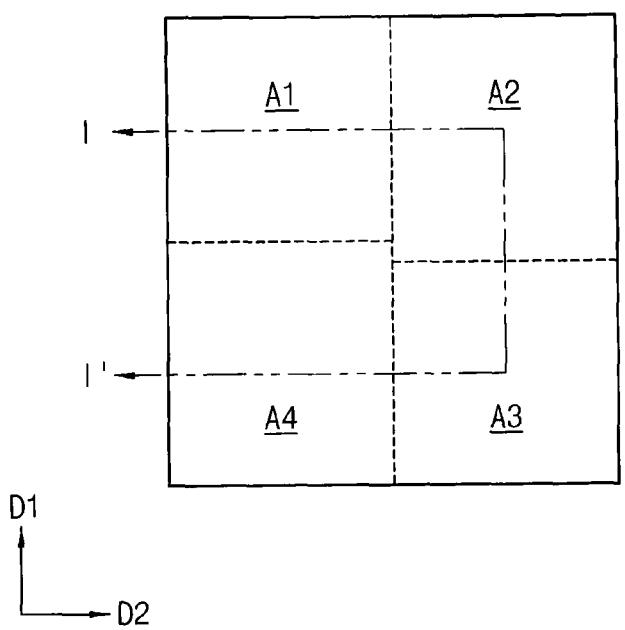
FIGS. 4A, 4B, 4C, 4D, 4E, 4F, 4G, 4H, 4I, 4J, 4K, 4L, 4M, 4N, 4O, 4P, 4Q, 4R, 4S, 4T, 4U, 4V, 4W, and 4X are plan views and cross-sectional views illustrating an imprint lithography method according to an exemplary embodiment of the inventive concept.
Figure 4B:
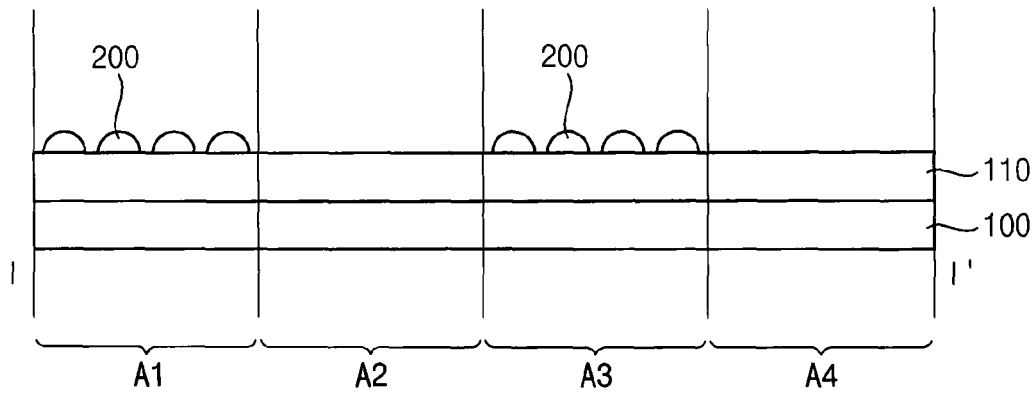

Referring to FIGS. 4A and 4B, a first layer 110 may be formed on a base substrate 100.

The base substrate 100 may include a first area A1, a second area A2, a third area A3, and a fourth area A4. The first to fourth areas A1, A2, A3 and A4 may be arranged in a 2×2 matrix form. For example, the fourth area A4 may be disposed adjacent to the first area A1 in a first direction D1. The second area A2 may be disposed adjacent to the first area A1 in a second direction D2 which crosses the first direction D1. The third area A3 may be disposed adjacent to the second area A3 in a first direction D2. The fourth area A4 may be disposed adjacent to the third area A3 in the second direction D2. The second direction D2 may be substantially perpendicular to the first direction D1.

The first area A1 may be spaced apart from the third area A3. The second area A2 may be disposed adjacent to the fourth area A4.

A first resin solution 200 may be provided on the first layer 110 in the first area A1 and the third area A3. In an exemplary embodiment, the first resin solution 200 may be provided in the first and third areas A1 and A3 and a portion which is adjacent to the first and third areas A1 and A3. The first resin solution 200 may be provided by droplets on the first layer 110.

Figure 4C:
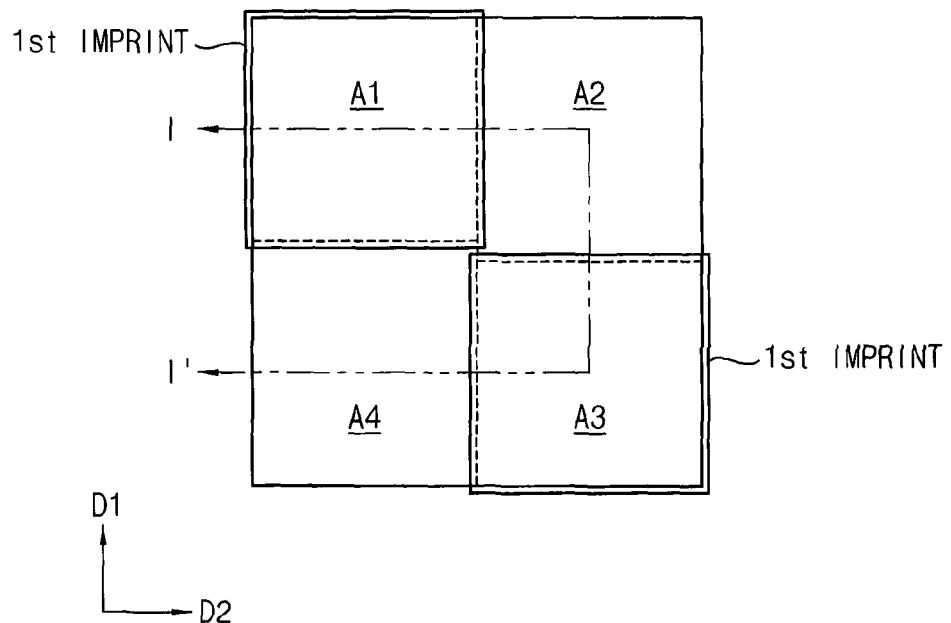
Figure 4D:
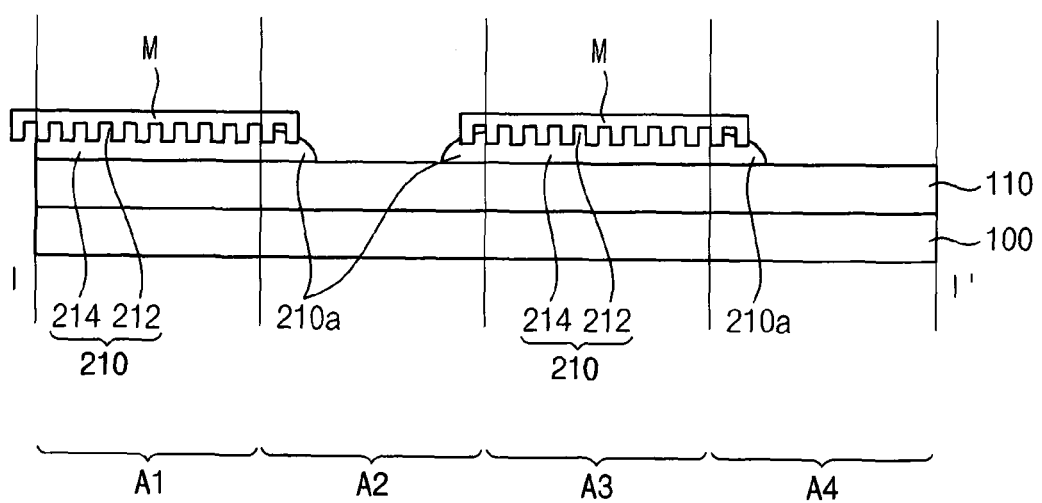

Referring to FIGS. 4C and 4D, A first preliminary pattern 210 may be formed the first layer 110 in the first area A1 and the third area A3.

The first preliminary pattern 210 may be formed by pressing an imprint mold M on the first resin solution 200 on the first layer 110 in the first area A1 and the third area A3. Accordingly, first imprint process (1st imprint) may be performed. Here, a portion of the first resin solution 200 may be overflowed outside of the first area A1 and the third area A3, so that a first overflowed portion 210a may be formed. Thus, the first overflowed portion 210a may be formed in the second area A2 and the fourth area A4. The imprint mold M may include a plurality of protrusion patterns having the same shape and formed in uniform distances.

Accordingly, the first preliminary pattern 210 may be formed in the first and third areas A1 and A3. The first overflowed portion 210a may be formed in the second area A2 and the fourth area A4.

The first preliminary pattern 210 may include a residual layer 214 formed on the first layer 110, and a plurality of protrusions 212 on the residual layer 214.

The first imprint process (1st imprint) in the first area A1 and in the third area A3 may be performed in order or at the same time.

Here, in a plan view, the first area A1 and the third area A3 which the first imprint process is performed are spaced apart from each other. Thus, although the first imprint process in the first area A1 and the first imprint process in the third area A3 are performed in order or at the same time, the first overflowed portion 210a overflowed from the first area A1 may not influence the third area A3. Thus, the resin solution does not inflow into the third area A3 during the first imprint process in the first area A1, and the resin solution does not inflow into the first area A1 during the first imprint process in the third area A3.

Then, a first imprint pattern (see 220 of FIG. 4F) may be formed by etching the first preliminary pattern 210 to remove the residual layer 214 between the protrusions. Here, the first overflowed portion 210a may be partially removed, so that a first residual-overflowed portion (see 220a of FIG. 4F) may be formed.

Figure 4E:
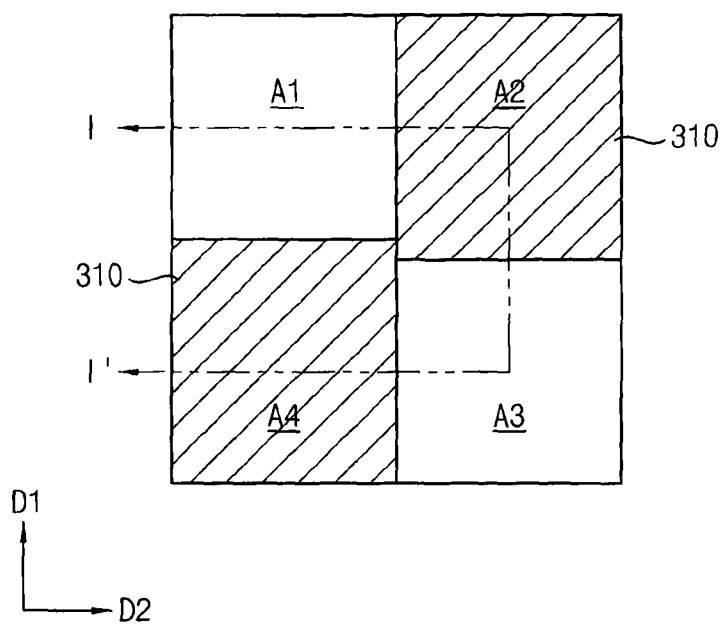
Figure 4F:
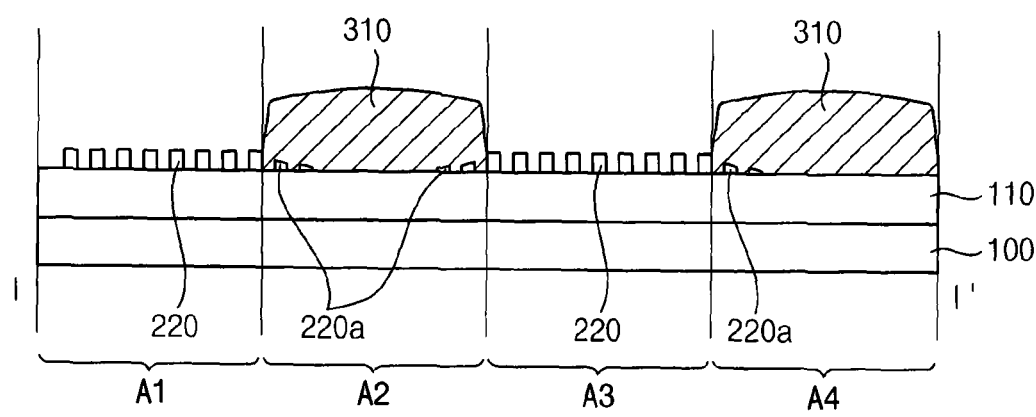

Referring to FIGS. 4E and 4F, a first resist pattern 310 may be formed in the second area A2 and the fourth area A4 on the first layer 110 on which the first imprint pattern 220 is formed. The first resist pattern 310 may cover the first layer 110 and the first residual-overflowed portion 220a in the second area A2 and the fourth area A4.

A photoresist layer may be formed on the first layer 110 on which the first imprint pattern 220 is formed. Then, the first resist pattern 310 may be formed by exposure and development of the photoresist layer using an additional mask configured to remain portions of the photoresist layer which corresponds to the second area A2 and the fourth area A4.

Then, the first layer 110 may be partially removed using the first imprint pattern 220 and the first resist pattern 310 as a mask. For example, the first layer 110 may be dry etched using the first imprint pattern 220 and the first resist pattern 310 as an etch barrier. Here, the first resist pattern 310 covers the second area A2 and the fourth area A4, so that portions of the first layer 110 which corresponds to the second area A2 and the fourth area A4 may remain, and the first layer 110 in the first and third area A1 and A3 may be patterned into a first layer pattern. (see 110a of FIG. 4H)

Then, the first imprint pattern 220 which remains in the first and third area A1 and A3 may be removed.

Figure 4G:
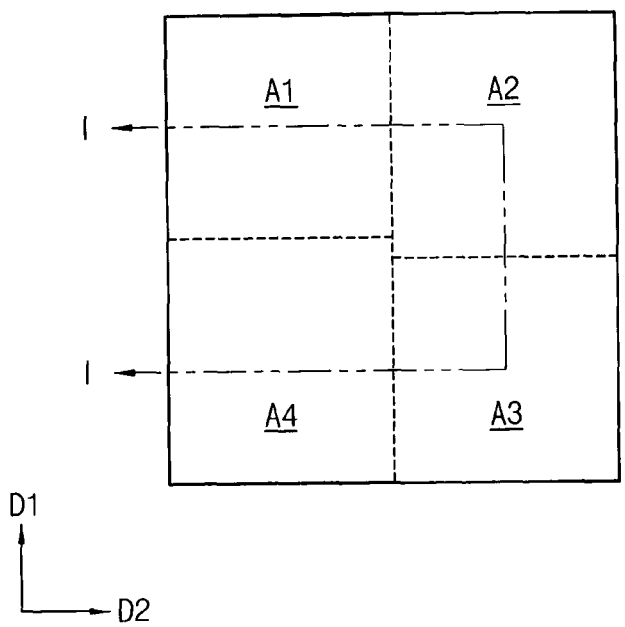
Figure 4H:
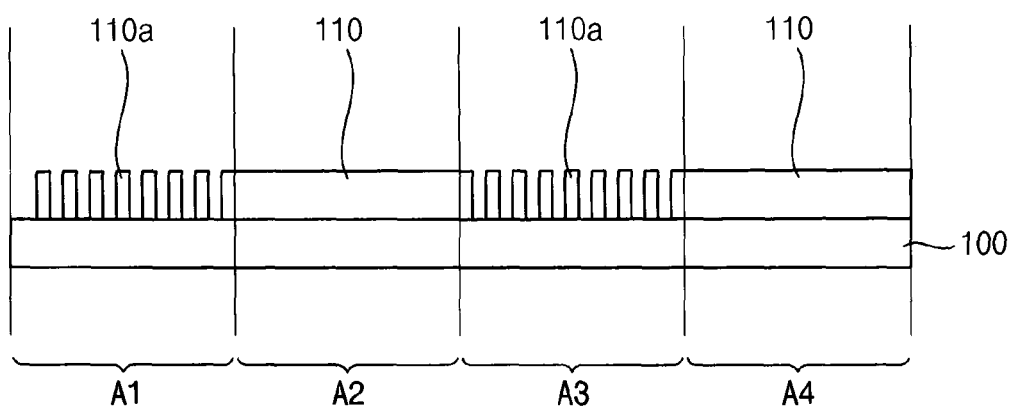

Referring to FIGS. 4F, 4G, and 4H, the first resist pattern 310 and the first overflowed portion 210a may be removed to expose the first layer 110 in the second area A2 and the fourth area A4.

According to the first imprint process, the first layer pattern 110a may be formed in the first area A1 and the third area A3.

Figure 4I:
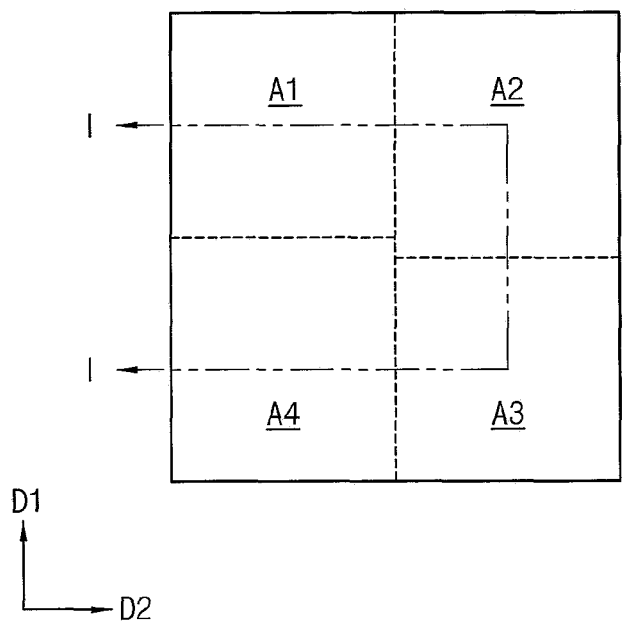
Figure 4J:
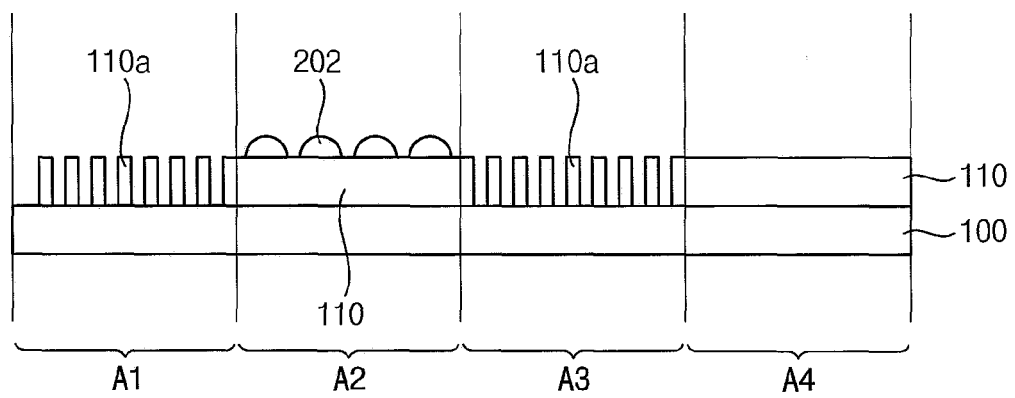

Referring to FIGS. 4I and 4J, a second resin solution may be provided on the first layer 110 in the second area A2. In an exemplary embodiment, the second resin solution may be provided in the second area A2 and a portion which is adjacent to the second area A2. The second resin solution may be provided with droplet on the first layer 110.

Figure 4K:
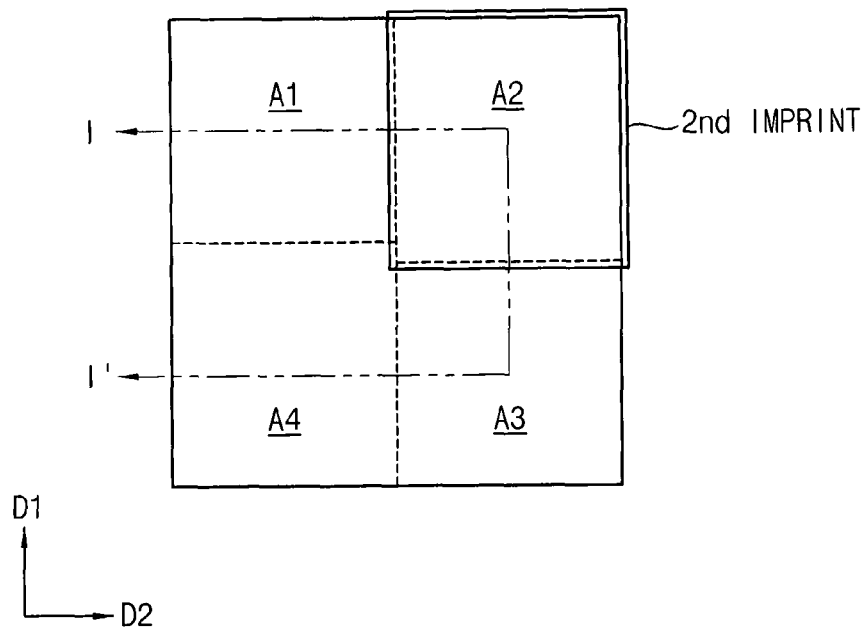
Figure 4L:
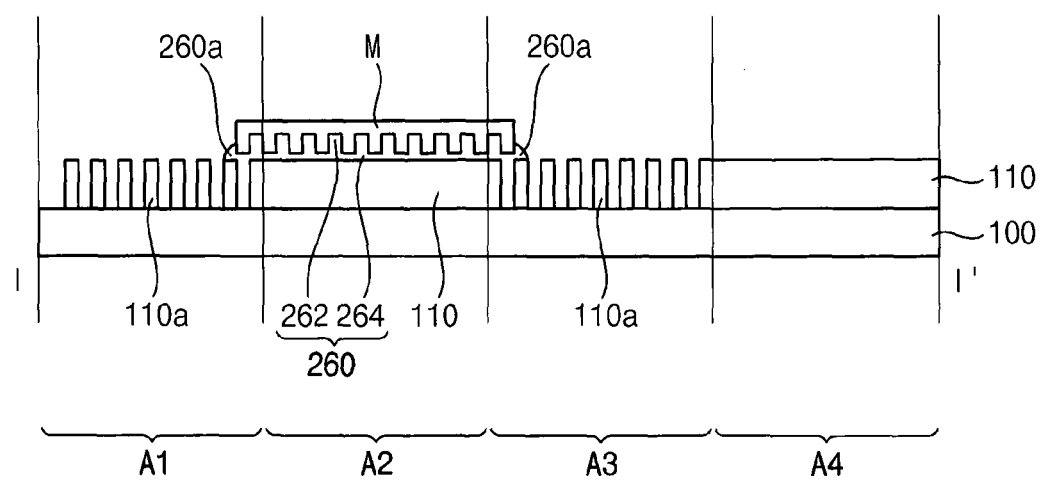

Referring to FIGS. 4K and 4L, the second preliminary pattern 260 may be formed by pressing the imprint mold M on the second resin solution. Accordingly, second imprint process (2nd imprint) may be performed. Here, a portion of the second resin solution may be overflowed outside of the second area A2, so that a second overflowed portion 260a may be formed in the first area A1, the fourth area A4, and the third area A3.

The imprint mold M may be same as that of the first imprint process or may have size different from size of the imprint mold of the first imprint process.

Accordingly, the second preliminary pattern 260 in the second area A2, and the second overflowed portion 260a in the first, third and fourth areas A1, A3, and A4 may be formed.

The second preliminary pattern 260 may include a residual layer 264 formed on the first layer 110, and a plurality of protrusions 262 on the residual layer 264. Then, a second imprint pattern (see 270 of FIG. 4N) may be formed by etching the second preliminary pattern 260 to remove the residual layer 264 between the protrusions. Here, the second overflowed portion 260a may be partially removed, so that a second residual-overflowed portion (see 270a of FIG. 4N) may be formed.

Figure 4M:
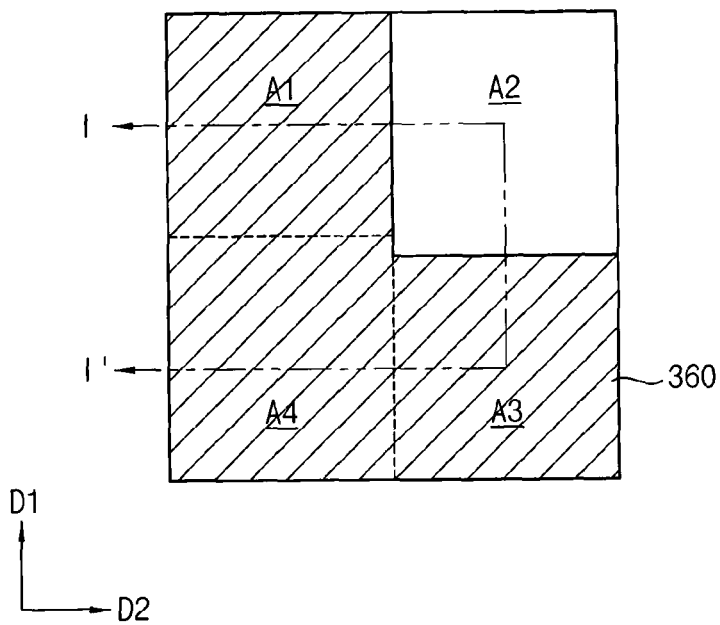
Figure 4N:
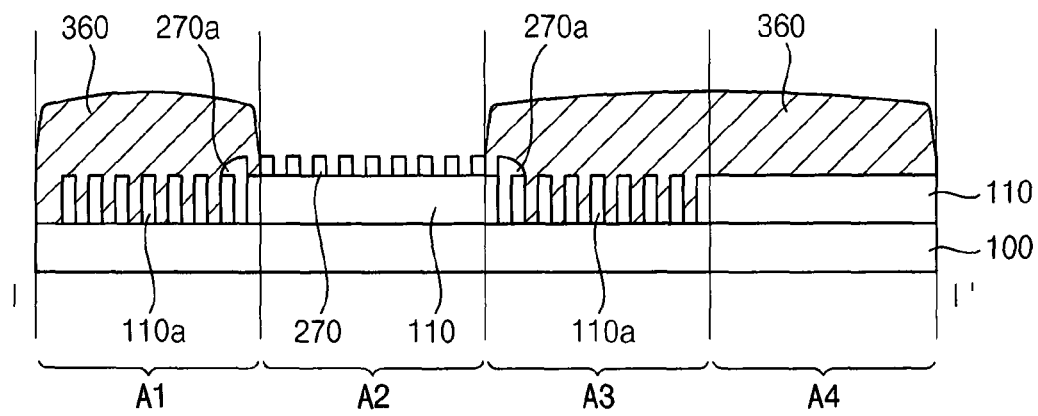

Referring to FIGS. 4M and 4N, a second resist pattern 360 may be formed in the first, third and fourth areas A1, A3, and A4 on the first layer pattern 110a. The second resist pattern 360 may cover the first layer 110 and the second residual-overflowed portion 270a in the first third and fourth areas A1, A3, and A4.

A photoresist layer may be formed on the first layer 110 on which the second imprint pattern 270 is formed. Then, the second resist pattern 360 may be formed by exposure and development of the photoresist layer using an additional mask configured to remain portions of the photoresist layer which corresponds to the first, third and fourth areas A1, A3, and A4.

Then, the first layer 110 may be partially removed using the second imprint pattern 270 and the second resist pattern 360 as a mask. For example, the first layer 110 may be dry etched using the second imprint pattern 270 and the second resist pattern 360 as an etch barrier. Here, the second resist pattern 360 covers the first, third, and fourth areas A1, A3, and A4, so that portions of the first layer 110 which corresponds to the first, third and fourth areas A1, A3, and A4 may remain, and the first layer 110 in the second area A2 may be patterned into the first layer pattern. (see 110a of FIG. 4P)

Then, the second imprint pattern 270 which remains in the second area A2 may be removed.

Figure 4O:
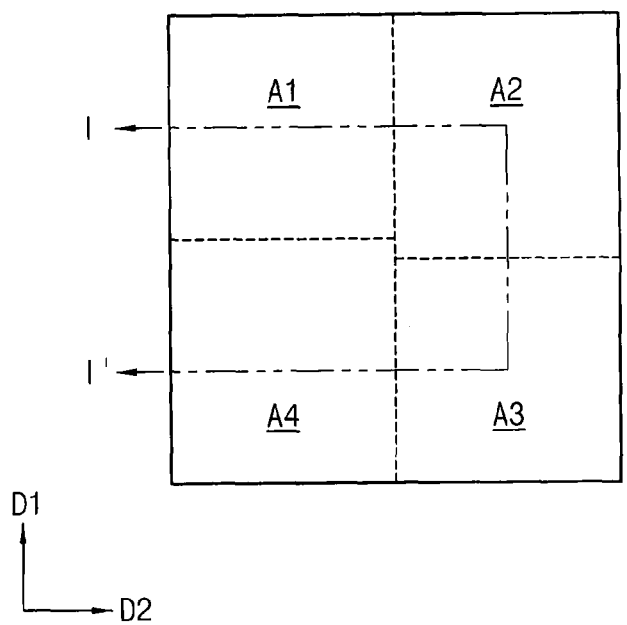
Figure 4P:
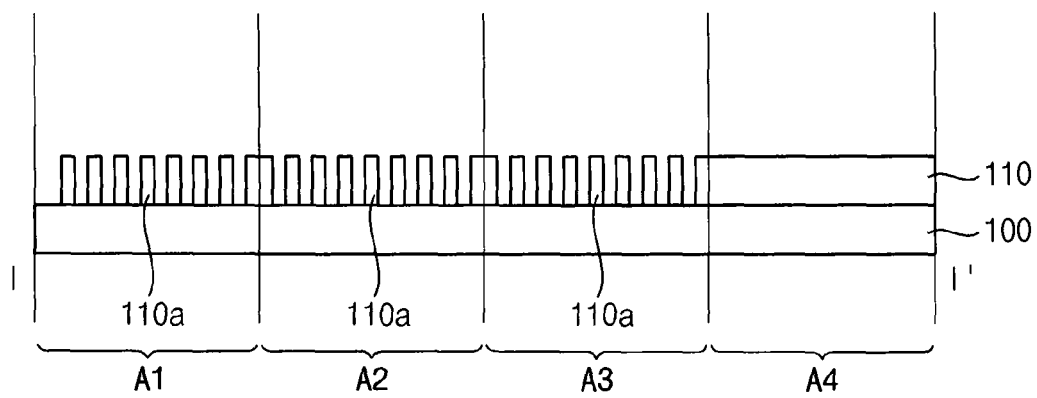

Referring to FIGS. 4N, 4O, and 4P, the second resist pattern 360 and the second residual-overflowed portion 270a may be removed, so that the first layer pattern 110a in the first area A1 and the third area A3 and the first layer 110 in the fourth area A4 may be exposed.

According to the second imprint process, the first layer pattern 110a may be formed in the second area A2.

Figure 4Q:
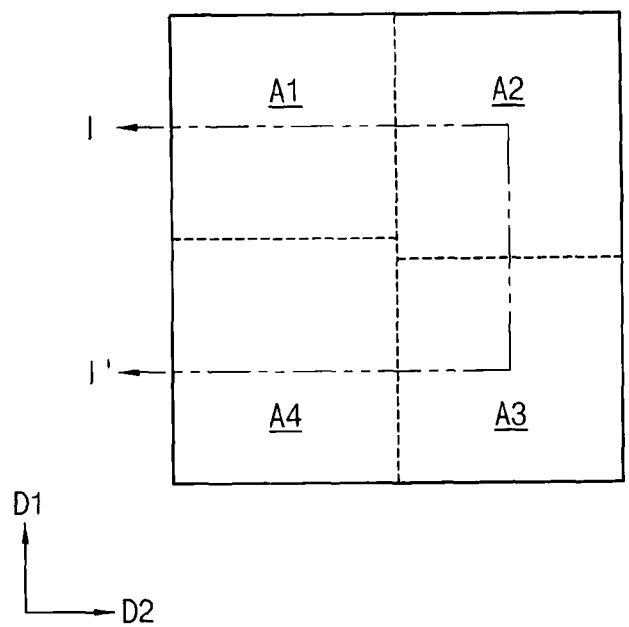
Figure 4R:
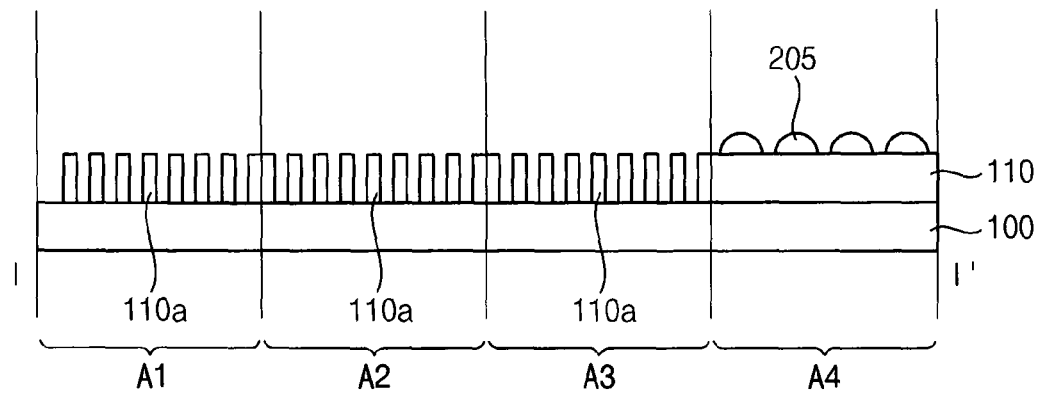

Referring to FIGS. 4Q and 4R, a third resin solution 205 may be provided on the first layer 110 in the fourth area A4. In an exemplary embodiment, the third resin solution 205 may be provided in the fourth area A4 and a portion which is adjacent to the fourth area A4. The third resin solution 205 may be provided by droplets on the first layer 110.

Figure 4S:
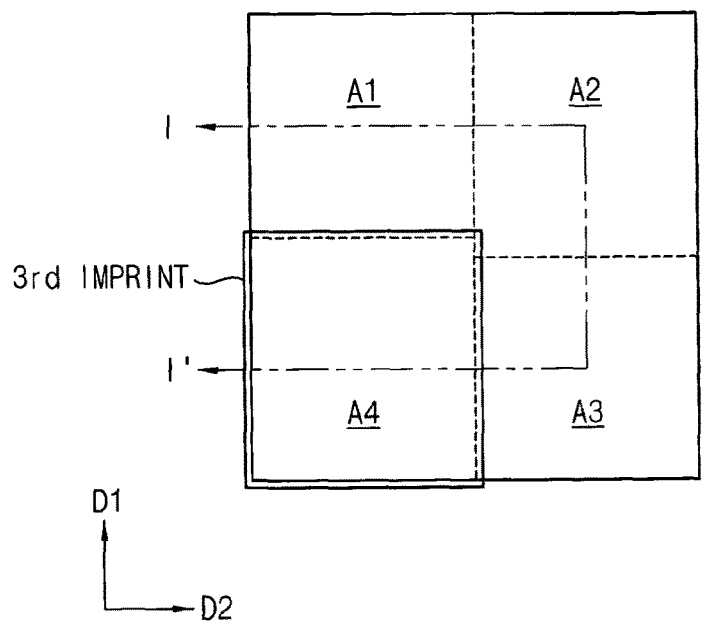
Figure 4T:
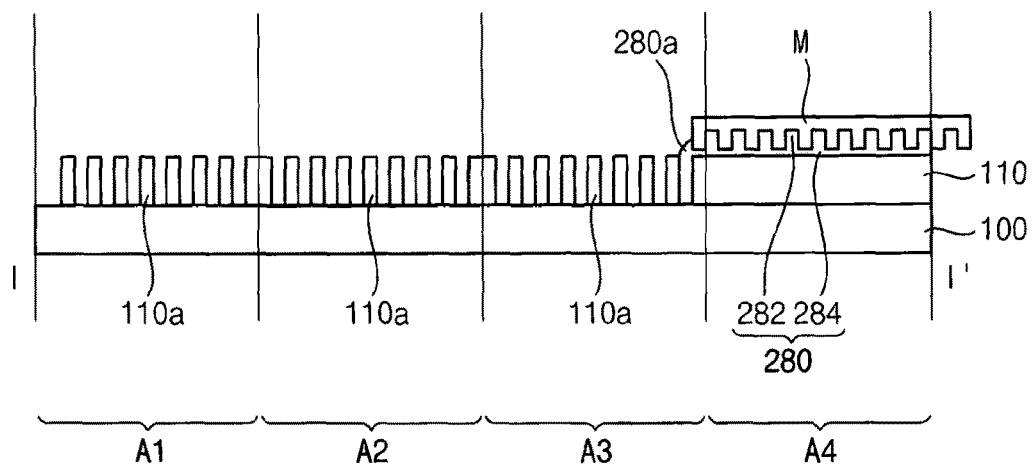

Referring to FIGS. 4S and 4T, a third preliminary pattern 280 may be formed by pressing the imprint mold M on the third resin solution 205 on the first layer 110 in the fourth area A4. Accordingly, third imprint process (3rd imprint) may be performed. Here, a portion of the third resin solution 205 may be overflowed outside of the fourth area A4, so that a third overflowed portion 280a may be formed. Thus, the third overflowed portion 280a may be formed in the first area A1, the second area A2 and the third area A3.

The imprint mold M may be same as the imprint mold of the second imprint process.

Accordingly, the third preliminary pattern 280 may be formed in the fourth area A4. The third overflowed portion 280a may be formed in the first area A1, the second area A2 and the third area A3

The third preliminary pattern 280 may include a residual layer 284 formed on the first layer 110, and a plurality of protrusions 282 on the residual layer 284.

Then, a third imprint pattern (see 290 of FIG. 4V) may be formed by etching the third preliminary pattern 280 to remove the residual layer 284 between the protrusions. Here, the third overflowed portion 280a may be partially removed, so that a third residual-overflowed portion (see 290a of FIG. 4V) may be formed.

Figure 4U:
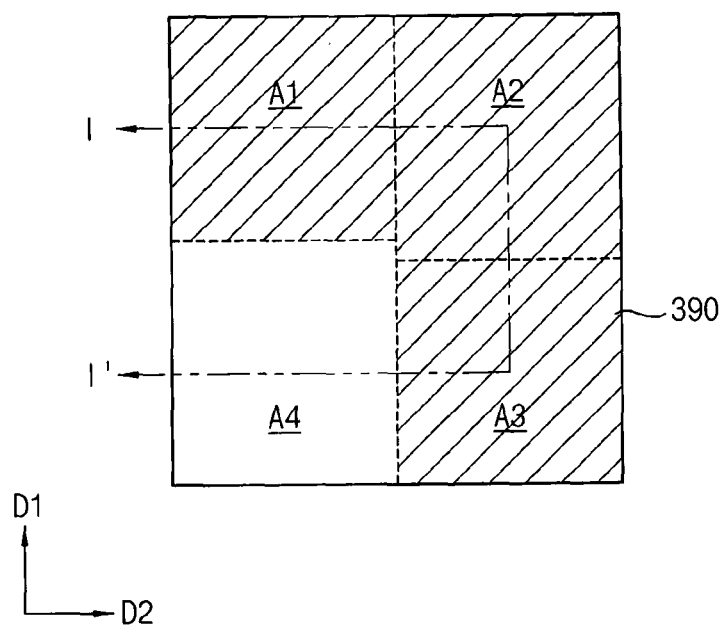
Figure 4V:
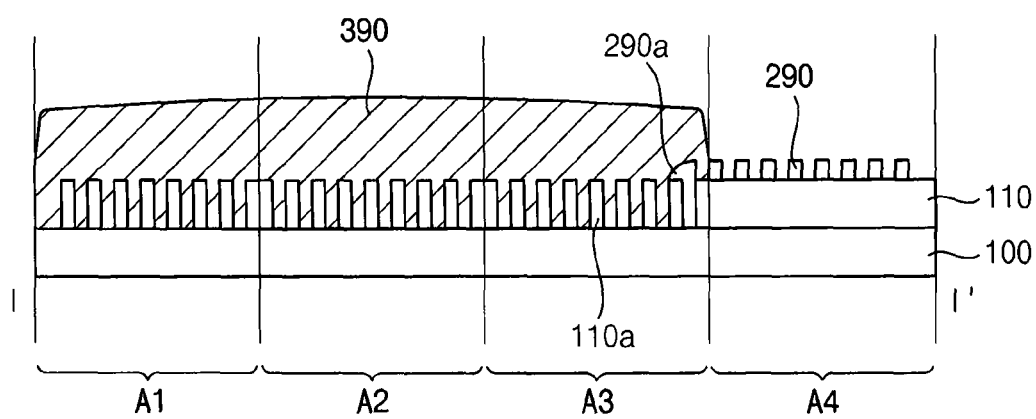

Referring to FIGS. 4U and 4V, a third resist pattern 390 may be formed in the first, second and third areas A1, A2 and A3 on the first layer 110 on which the third imprint pattern 290 is formed. The third resist pattern 390 may cover the first layer 110 and the third residual-overflowed portion 290a in the first area A1, the second area A2 and the third area A3.

A photoresist layer may be formed on the first layer 110 on which the third imprint pattern 290 is formed. And then, the third resist pattern 390 may be formed by exposure and development of the photoresist layer using an additional mask configured to remain portions of the photoresist layer which corresponds to the first area A1, the second area A2 and the third area A3.

Then, the first layer 110 may be partially removed using the third imprint pattern 290 and the third resist pattern 390 as a mask. For example, the first layer 110 may be dry etched using the third imprint pattern 290 and the third resist pattern 390 as an etch barrier. Here, the third resist pattern 390 covers the first, second, and third areas A1, A2, and A3, so that portions of the first layer 110 which corresponds to the first, second, and third areas A1, A2, and A3 may remain, and the first layer 110 in the fourth area A4 may be patterned into a first layer pattern. (see 110a of FIG. 4X).

Then, the third imprint pattern 290 which remains in the fourth area A4 may be removed.

Figure 4W:
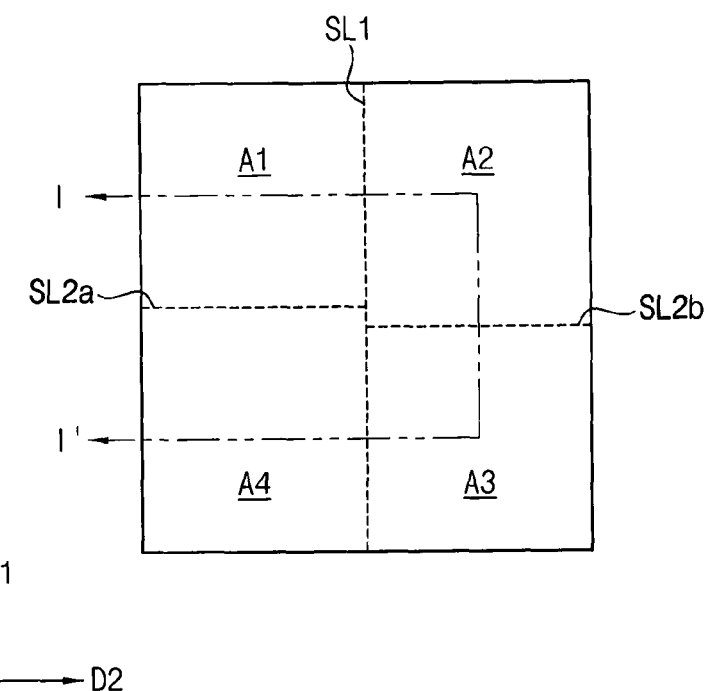
Figure 4X:
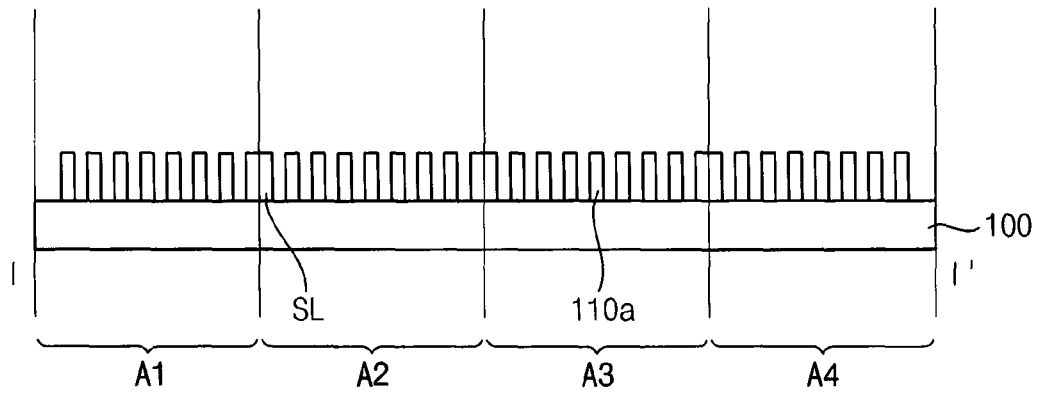

Referring to FIGS. 4V, 4W, and 4X, the third resist pattern 390 and the third overflowed portion 290a may be removed to expose the first layer 110 in the first area A1, the second area A2, and the third area A3.

According to the third imprint process, the first layer pattern 110a may be formed in the fourth area A4.

Accordingly, a large area substrate having the substrate 100 and the first layer pattern 110a by a plurality of imprint process may be formed. The large area substrate is larger than the imprint mold.

Here, the substrate may include a stitch line SL where the first layer pattern 110a is unevenly formed. The stitch line may a boundary of the areas where pitch of the pattern is different, or may be a portion where the protrusions are not evenly aligned or forms a gap.

For example, the substrate may include a first stitch line SL1 (dotted line in figure) which extends in the first direction D1 and formed between the first area A1 and the second area A2, and between the third area A3 and the fourth area A4. In addition, the substrate may include a second stitch line SL2 which extends in the second direction D2 and formed between the first area A1 and the fourth area A4, and between the second area A2 and the third area A3.

The second stitch line includes a first portion SL2a and a second portion SL2b. The first portion SL1a and the second portion SL2b are discontinuously formed in the second direction D2. Thus, the first portion SL2a is disposed between the first area A1 and the fourth area A4, the second portion SL2b is disposed between the second area A2 and the third area A3, and a boundary of the first area A1 and the fourth area A4 and a boundary of the second area A2 and the third area A3 are spaces apart from each other in the first direction D1, so that the second stitch line may be discontinuously extended.

According to the present exemplary embodiment, when a plurality of imprint processes to the areas is performed, the number of photolithography process may be reduced. A portion of the boundary of the areas which form the stitch line may be discontinuously extended, so that defective pattern due to overlapping of the imprint patterns near the boundary may be reduced. Accordingly, the pattern quality may be improved.

A master template for large area process and a wire grid polarizer may be manufactured by the imprint lithography method of the present embodiment. For example, the master template for imprint may be formed by the method, and then an imprint mold is duplicated using the master template, and then the wire grid polarizer may be mass-produced using the duplicated imprint mold.

Figure 5A:
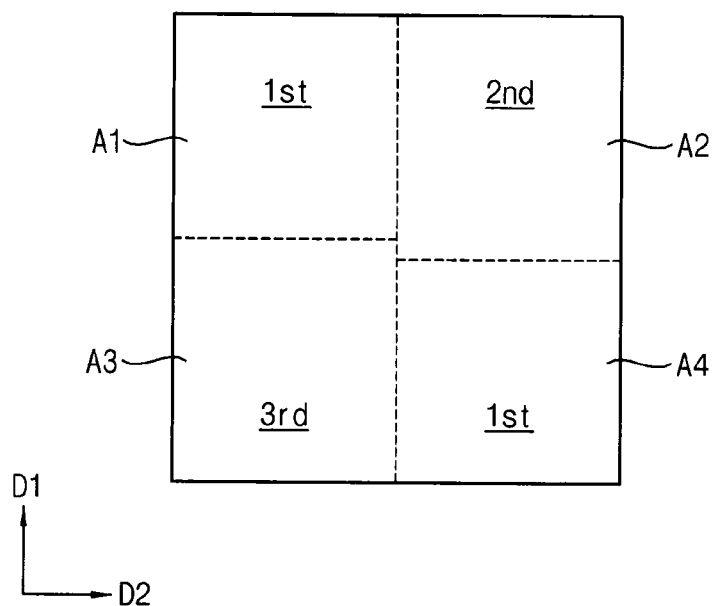
FIGS. 5A, 5B, and 5C are plan views illustrating an imprint lithography method for a substrate having 2×2 area according to an exemplary embodiment of the inventive concept.
Figure 5B:
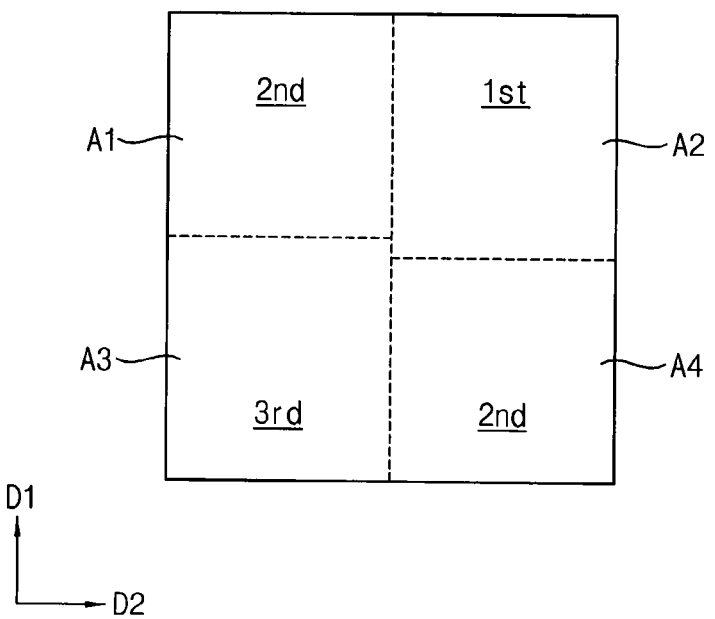
Figure 5C:
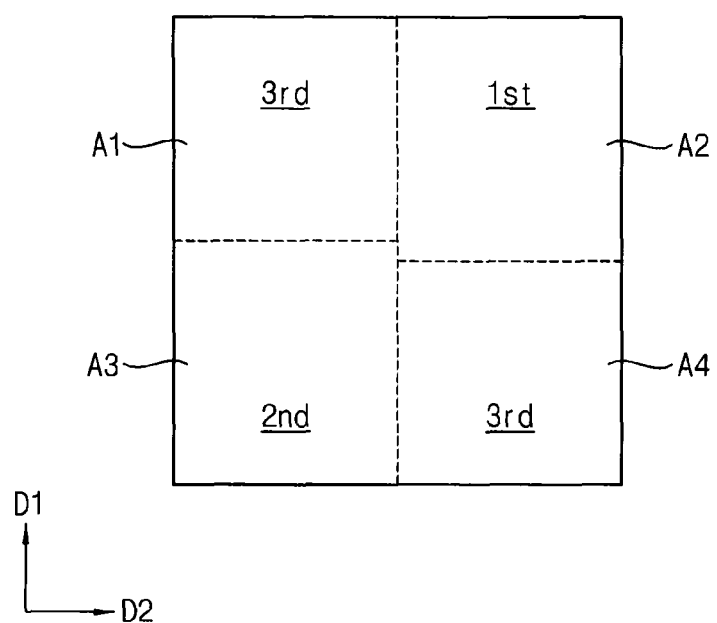

FIGS. 5A, 5B, and 5C are plan views illustrating an imprint lithography method for a substrate having a 2×2 area according to an exemplary embodiment of the inventive concept. The imprint lithography method is substantially same as the method of FIGS. 4A, 4B, 4C, 4D, 4E, 4F, 4G, 4H, 4I, 4J, 4K, 4L, 4M, 4N, 4O, 4P, 4Q, 4R, 4S, 4T, 4U, 4V, 4W, and 4X, except for a process order of a plurality of imprint lithography processes. Thus, any further detailed descriptions concerning the same elements will be omitted.

Referring to FIG. 5A, the substrate includes the first to fourth areas A1 to A4 which are arranged in a 2×2 matrix form in a second direction D2 and in a first direction D1 which crosses the second direction D2. A large area pattern may be formed on the substrate by three imprint lithography processes.

By a first imprint lithography process, a pattern may be formed in the first area A1 and the fourth area A4 which is spaced apart from the first area A1.

Then, by a second imprint lithography process, a pattern may be formed in the second area A2 which is adjacent to the first area A1 in the second direction D2 and adjacent to the fourth area A4 in the first direction D1.

And then, by a third imprint lithography process, a pattern may be formed in the third area A3 which is adjacent to the first area A1 in the first direction D1 and adjacent to the fourth area A4 in the second direction D2.

Accordingly, the pattern may be formed on the whole substrate. Here, a stitch line (dotted line in figure) where the pattern is not uniformly formed may be formed at a boundary of two areas adjacent each other. The stitch line may include a first stitch line extending in the first direction D1 and a second stitch line extending in the second direction D2. The second stitch line may be discontinuously extended. Thus, the second stitch line may include a plurality of portions which are spaced apart each other in the first direction D1.

According to the present exemplary embodiment, the boundaries of the areas which form the stitch line may be alternately disposed. When a plurality of imprint processes to the areas is performed, the number of photolithography process may be minimized. A defective pattern due to overlapping of the imprint patterns near the boundary may be reduced. Accordingly, the pattern quality may be improved.

Referring to FIG. 5B, the substrate includes the first to fourth areas A1 to A4 which arranged in a 2×2 matrix form in a second direction D1 and in a first direction D1 which crosses the second direction D2. A large area pattern may be formed on the substrate by three imprint lithography processes. Positions of the first to fourth areas A1 to A4 are substantially same as that of FIG. 5A.

By a first imprint lithography process, a pattern may be formed in the second area A2.

By a second imprint lithography process, a pattern may be formed in the first area A1 which is adjacent to the second area A2 in the second direction D2 and the fourth area A4 which is adjacent to the second area A2 in the first direction D1 and spaced apart from the first area A1.

Then, by a third imprint lithography process, a pattern may be formed in the third area A3 which is adjacent to the first area A1 in the first direction D1 and adjacent to the fourth area A4 in the second direction D2.

Accordingly, the pattern may be formed on the whole substrate.

Referring to FIG. 5C, the substrate includes the first to fourth areas A1 to A4 which arranged in a 2×2 matrix form in a second direction D1 and in a first direction D1 which crosses the second direction D2. A large area pattern may be formed on the substrate by three imprint lithography processes. Positions of the first to third areas A1 to A4 are substantially same as that of FIG. 5A.

By a first imprint lithography process, a pattern may be formed in the second area A2.

By a second imprint lithography process, a pattern may be formed in the third area A3.

Then, by a third imprint lithography process, a pattern may be formed in the first area A1 which is adjacent to the third area A3 in the first direction D1 and adjacent to the second area A2 in the second direction D2 and in the fourth area A4 which is adjacent to the third area A3 in the second direction D2, adjacent to the second area A2 in the first direction D1 and spaced apart from the first area A1.

Accordingly, the pattern may be formed on the whole substrate.

A master template for large area process and a wire grid polarizer may be manufactured by the imprint lithography method of the present embodiment. For example, the master template for imprint may be formed by the method, an imprint mold is duplicated using the master template, and then the wire grid polarizer may be mass-produced using the duplicated imprint mold.

Figure 6A:
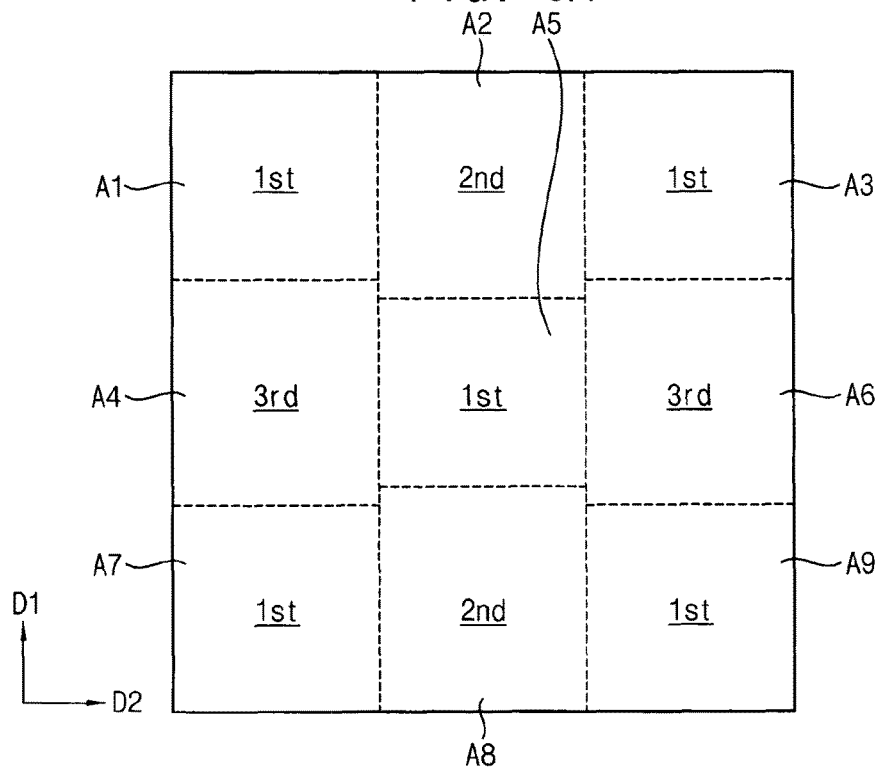
FIGS. 6A, 6B, and 6C are plan views illustrating an imprint lithography method for a substrate having 3×3 area according to an exemplary embodiment of the inventive concept.
Figure 6B:
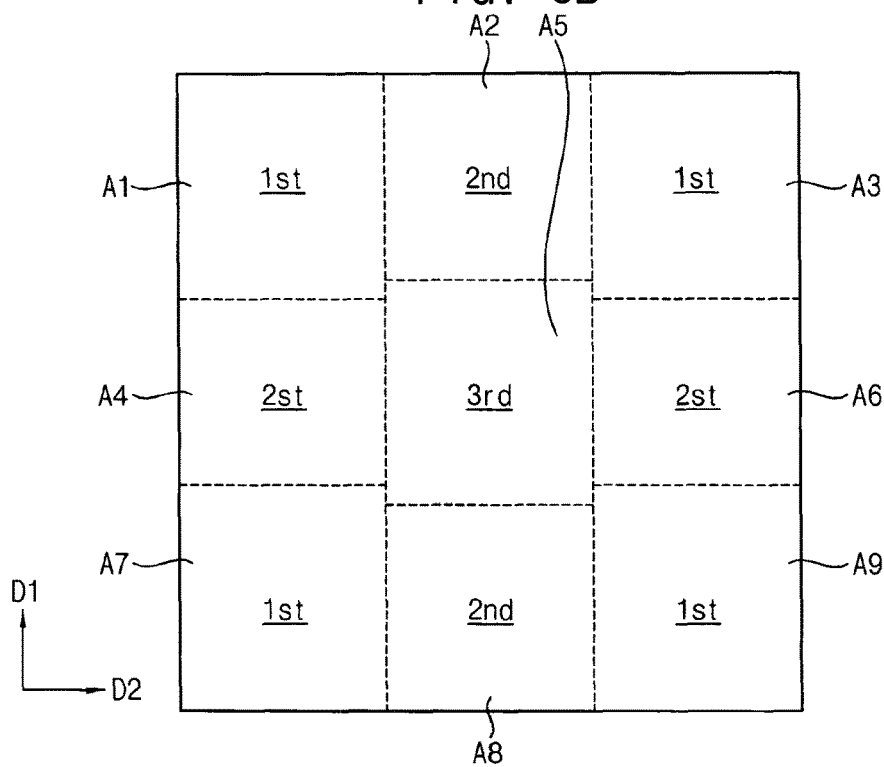
Figure 6C:
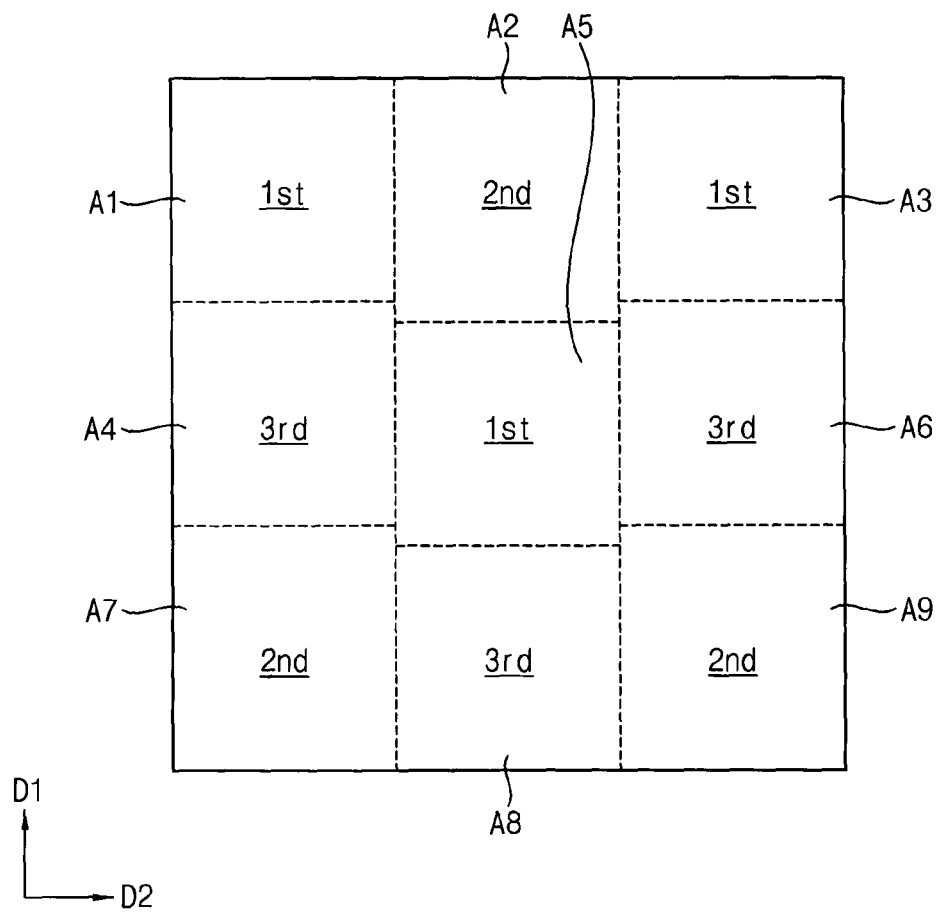

FIGS. 6A, 6B, and 6C are plan views illustrating an imprint lithography method for a substrate having 3×3 area according to an exemplary embodiment of the inventive concept. The imprint lithography method is substantially similar to the method of FIGS. 5A, 5B, and 5C, except for size of a substrate, areas of the substrate, and process order of a plurality of imprint lithography processes. Thus, any further detailed descriptions concerning the same elements will be omitted.

Referring to FIG. 6A, the substrate includes the first to ninth areas A1 to A9 which arranged in a 3×3 matrix form in a second direction D2 and in a first direction D1 which crosses the second direction D2. A large area pattern may be formed on the substrate by three imprint lithography processes.

By a first imprint lithography process, a pattern may be formed in the first area A1, the third area A3, the fifth area A5, the seventh area A7, and the ninth area A9. The first area A1, the third area A3, the fifth area A5, the seventh area A7, and the ninth area A9 are spaced apart from each other.

By a second imprint lithography process, a pattern may be formed in the second area A2 and the eighth area A8. The second area A2 is adjacent to the first area A1 in the second direction D2, adjacent to the third area A3 in the second direction D2, and adjacent to the fifth area A5 in the first direction D1. The eighth area A8 is adjacent to the seventh area A7 in the second direction D2, adjacent to the ninth area A9 in the second direction D2, and adjacent to the fifth area A5 in the first direction D1. The second area A2 and the eighth area A8 may be spaced apart from each other.

And then, by a third imprint lithography process, a pattern may be formed in the fourth area A4 and the sixth area A6.

The fourth area A4 is disposed adjacent to the first area A1 in the first direction D1, adjacent to the seventh area A7 in the first direction D1, and adjacent to the fifth area A5 in the second direction D2. The sixth area A6 is disposed adjacent to the third area A3 in the first direction D1, adjacent to the ninth area A9 in the first direction D1, and adjacent to the fifth area A5 in the second direction D2. The fourth area A4 and the sixth area A6 is spaced apart from each other.

Accordingly, the pattern may be formed on the whole substrate.

An order of the first to third imprint lithography process may be changed.

Referring to FIG. 6B, the imprint lithography method is substantially same as the method of FIG. 6A, except for shape of a stitch line. By the first to third imprint lithography process, a pattern is formed on the whole substrate, and a stitch line (dotted line in figure) where the pattern is not uniformly formed may be formed at a boundary of two areas adjacent each other. Order of the first to third imprint lithography process may be changed.

The stitch line may include a plurality of first stitch lines extending in the first direction D1 and a plurality of second stitch lines extending in the second direction D2. Each of the second stitch lines may be discontinuously extended. Thus, the second stitch line may include a plurality of portions which are spaced apart each other in the first direction D1.

Referring to FIG. 6C, the imprint lithography method is substantially same as the method of FIG. 6A or 6B, except for shape of a stitch line. By the first to third imprint lithography process, a pattern is formed on the whole substrate, and a stitch line (dotted line in figure) where the pattern is not uniformly formed may be formed at a boundary of two areas adjacent each other. Order of the first to third imprint lithography process may be changed.

The stitch line may include a plurality of first stitch lines extending in the first direction D1 and a plurality of second stitch lines extending in the second direction D2. Each of the second stitch lines may be discontinuously extended. Thus, the second stitch line may include a plurality of portions which are spaced apart each other in the first direction D1.

A master template for large area process and a wire grid polarizer may be manufactured by the imprint lithography method of the present embodiment. For example, the master template for imprint may be formed by the method, and then an imprint mold is duplicated using the master template, and then the wire grid polarizer may be mass-produced using the duplicated imprint mold.

Figure 7A:
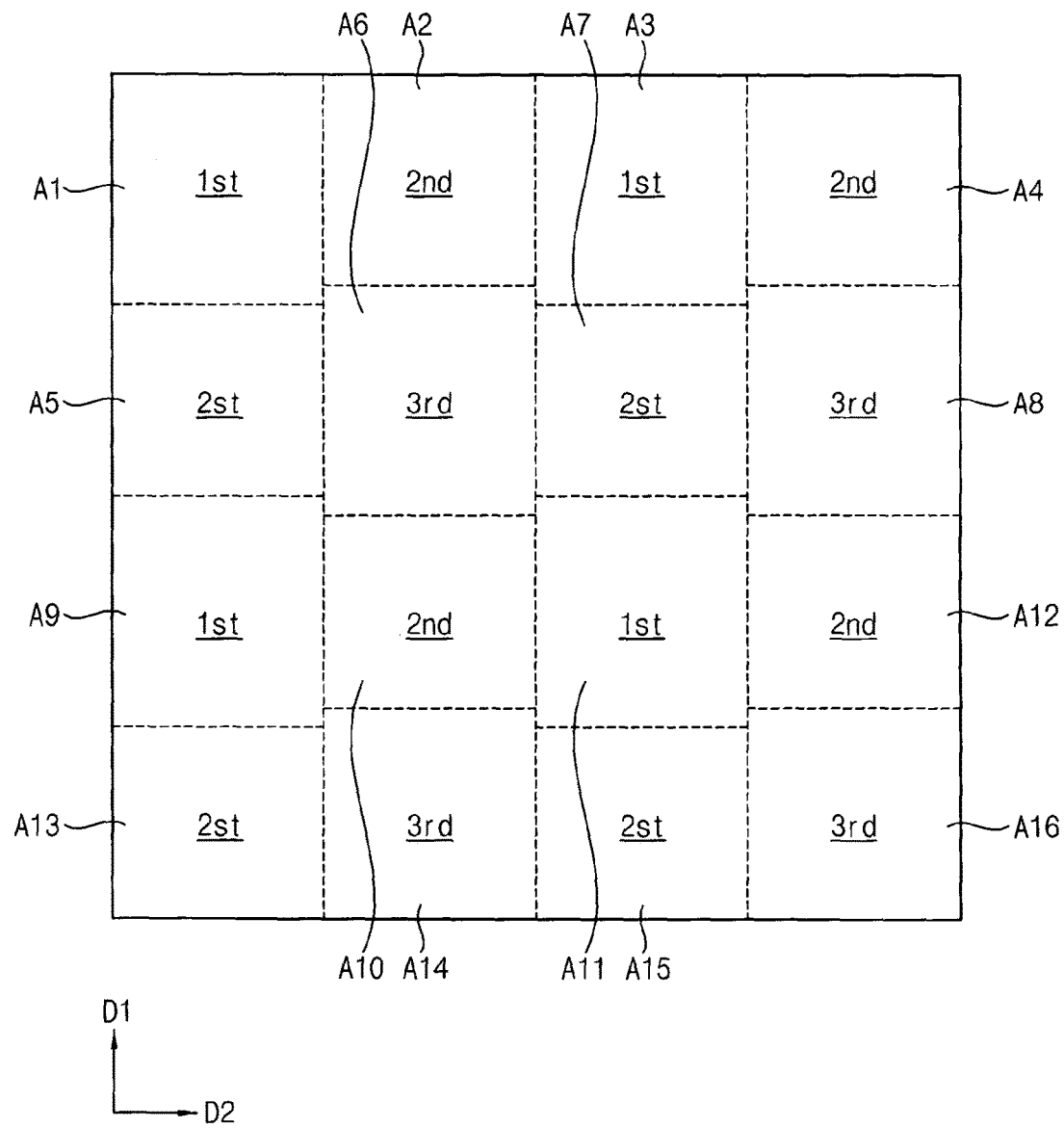

FIGS. 7A, 7B, and to 7C are plan views illustrating an imprint lithography method for a substrate having 4×4 area according to an exemplary embodiment of the inventive concept.

Referring to FIG. 7A, the substrate includes the first to sixteenth areas A1 to A16 which arranged in a 4×4 matrix form in a second direction D2 and in a first direction D1 which crosses the second direction D2. A large area pattern may be formed on the substrate by three imprint lithography processes.

By a first imprint lithography process, a pattern may be formed in the first area A1, the third area A3, the ninth area A9, and the eleventh area A11. The first, third, fifth, ninth and eleventh areas A1, A3, A9, and A11 are spaced apart from each other.

By a second imprint lithography process, a pattern may be formed in the second, fourth, fifth, seventh, tenth, twelfth, thirteenth and fifteenth areas A2, A4, A5, A7, A10, A12, A13 and A15. The second, fourth, fifth, seventh, tenth, twelfth, thirteenth and fifteenth areas A2, A4, A5, A7, A10, A12, A13 and A15 are spaced apart from each other.

By a third imprint lithography process, a pattern may be formed in the sixth, eighth, fourteenth, and sixteenth areas A6, A8, A14, and A16. The sixth, eighth, fourteenth, and sixteenth areas A6, A8, A14, and A16 are spaced apart from each other.

Accordingly, the pattern may be formed on the whole substrate. Here, a stitch line (dotted line in figure) where the pattern is not uniformly formed may be formed at a boundary of two areas adjacent each other. The stitch line may include a plurality of first stitch lines extending in the first direction D1 and a plurality of second stitch lines extending in the second direction D2. Each of the second stitch lines may be discontinuously extended. Thus, the second stitch line may include a plurality of portions which are spaced apart each other in the first direction D1.

According to the present exemplary embodiment, the boundaries of the areas which form the stitch line may be alternately disposed. When a plurality of imprint processes to the areas is performed, the number of photolithography process may be minimized. A defective pattern due to overlapping of the imprint patterns near the boundary may be reduced. Accordingly, the pattern quality may be improved.

Referring to FIG. 7B, the imprint lithography method is substantially same as the method of FIG. 7A, except for shape of a stitch line. By first to third imprint lithography process, a pattern is formed on the whole substrate, and a stitch line (dotted line in figure) where the pattern is not uniformly formed may be formed at a boundary of two areas adjacent each other. An order of the first to third imprint lithography process may be changed.

The stitch line may include a plurality of first stitch lines extending in the first direction D1 and a plurality of second stitch lines extending in the second direction D2. Each of the second stitch lines may be discontinuously extended. Thus, the second stitch line may include a plurality of portions which are spaced apart each other in the first direction D1.

Figure 7C:
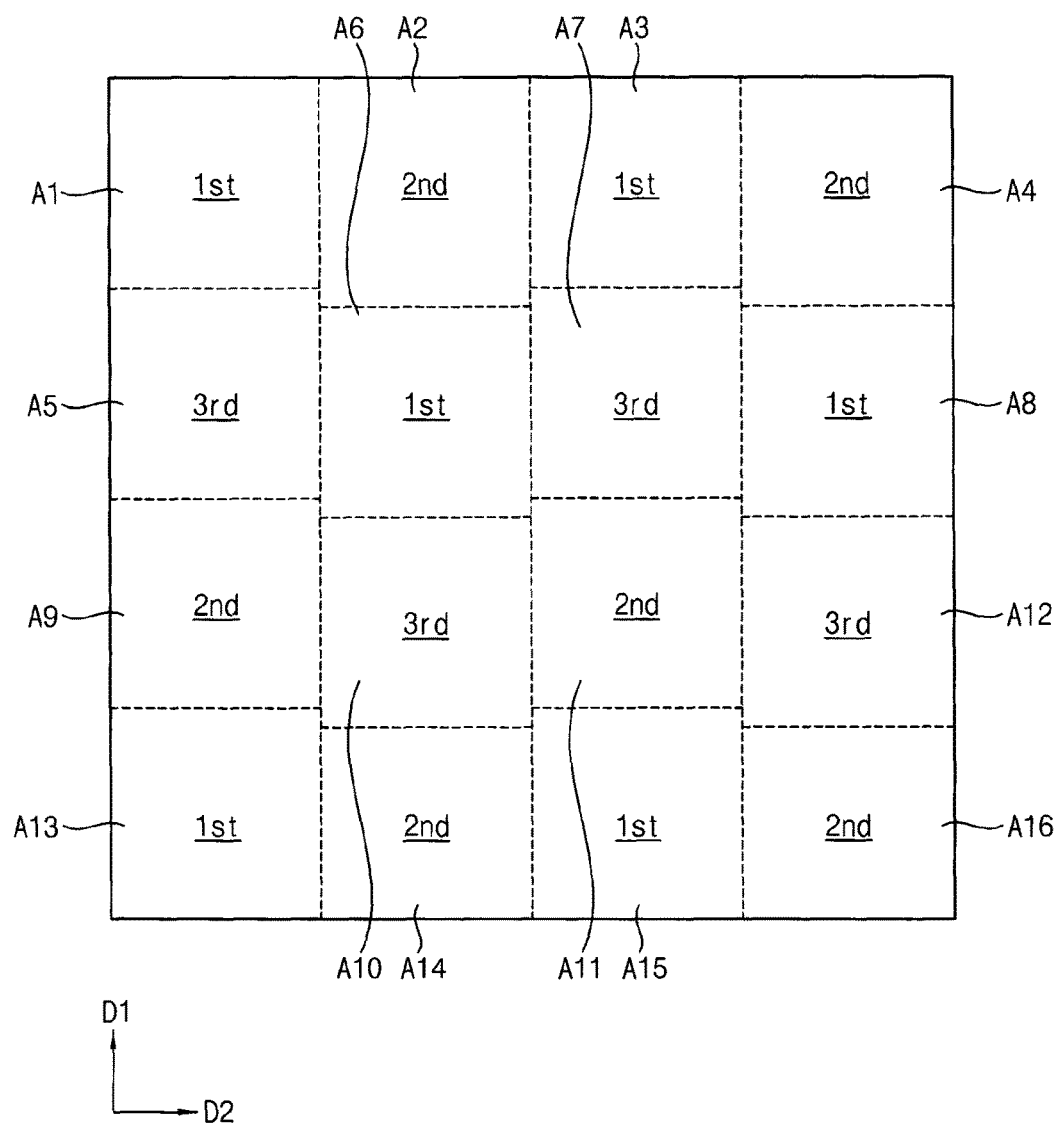

Referring to FIG. 7C, the imprint lithography method is substantially same as the method of FIG. 7A or 7B, except for shape of a stitch line. By first to third imprint lithography process, a pattern is formed on the whole substrate, and a stitch line (dotted line in figure) where the pattern is not uniformly formed may be formed at a boundary of two areas adjacent each other. Order of the first to third imprint lithography process may be changed.

The stitch line may include a plurality of first stitch lines extending in the first direction D1 and a plurality of second stitch lines extending in the second direction D2. Each of the second stitch lines may be discontinuously extended. Thus, the second stitch line may include a plurality of portions which are spaced apart each other in the first direction D1.

Although imprint lithography methods for substrates having areas arranged in 2×2, 3×3, and 4×4 matrix forms in FIGS. 5A, 5B, and 7C are described, the inventive concept is not limited to such embodiments. The imprint lithography methods may be applied to substrates having a plurality of areas in various arrangements.

Although the number of the areas of the substrate is larger than the above embodiment, a large area pattern may be formed on the whole substrate by three imprint lithography processes. In each of the imprint process, imprint may be performed to a plurality of areas which are spaced apart from each other.

Here, a stitch line where the pattern is not uniformly formed may be formed at a boundary of two areas adjacent each other. The stitch line may include a plurality of discontinuous portions.

According to the present exemplary embodiment, the boundaries of the areas which form the stitch line may be alternately disposed. When a plurality of imprint processes to the areas is performed, the number of photolithography process may be minimized. A defective pattern due to overlapping of the imprint patterns near the boundary may be reduced. Accordingly, the pattern quality may be improved.

A master template for large area process and a wire grid polarizer may be manufactured by the imprint lithography method of the present embodiment. For example, the master template for imprint may be formed by the method, and then an imprint mold is duplicated using the master template, and then the wire grid polarizer may be mass-produced using the duplicated imprint mold.

FIGS. 8A, 8B, 8C, 8D, 8E, 8F, 8G, and 8H are partial enlarged view of stitch lines according to an exemplary embodiment of the inventive concept.

Figure 8A:
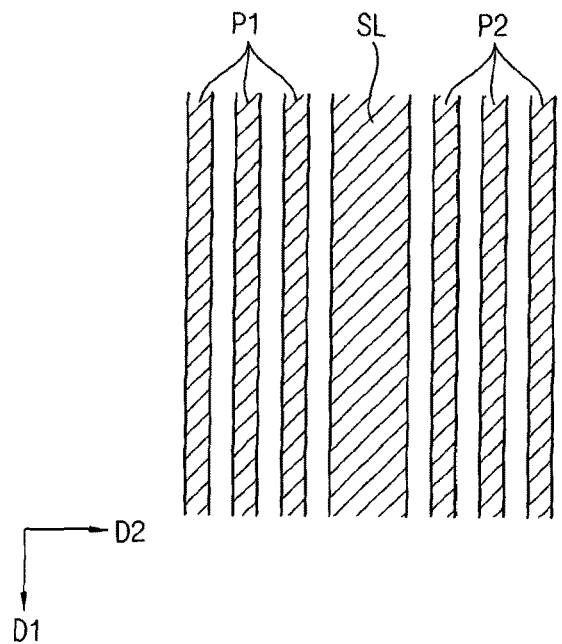
FIGS. 8A, 8B, 8C, 8D, 8E, 8F, 8G, and 8H are partial enlarged views of stitch lines according to an exemplary embodiment of the inventive concept.

Referring to FIG. 8A, a first pattern P1 is disposed on a substrate in a first area. A second pattern P2 may be disposed on the substrate in a second area which may be adjacent to the first area in a second direction D2 which crosses a first direction D1. The second direction D2 may be substantially perpendicular to the first direction D1. The first pattern P1 and the second pattern P2 may be a metal patterns formed on a base substrate. For example, the metal pattern may a wire grid pattern having fine wires extended in the first direction D1 and spaced apart from each other in the second direction D2. The wire grid pattern may have about 50 nm (nanometer) to 150 nm of pitch. The pitch is defined as a sum of width of the fine wire and a distance between the fine wires adjacent to each other.

A stitch line SL may be formed between the first pattern P1 of the first area and the second pattern P2 of the second area. The stitch line SL may be a line pattern extending in the first direction D1. For example, the stitch line SL may be a metal line pattern formed on the base substrate, and has a width wider than the fine wire of the wire grid pattern. Accordingly, the polarizing function where the stitch line SL is formed may be worse (i.e., lower) than the first and second area where the first and second patterns P1 and P2 are formed.

Figure 8B:
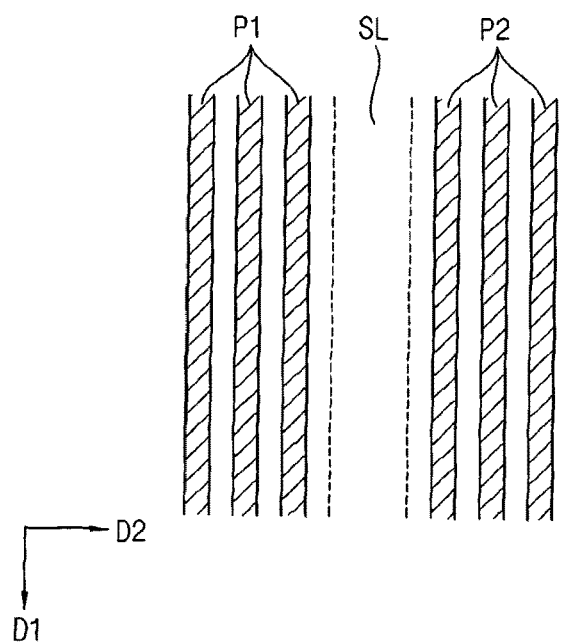

Referring to FIG. 8B, a first pattern P1 is disposed on a substrate in a first area. A second pattern P2 may be disposed on the substrate in a second area which may be adjacent to the first area in a second direction D2 which crosses a first direction D1. A stitch line SL may be formed between the first pattern P1 of the first area and the second pattern P2 of the second area. The present exemplary embodiment is substantially same as FIG. 8A, except for the stitch line SL.

The stitch line SL may be a blank pattern formed along the first direction D1. For example, the stitch line SL may be a blank area between a fine wire in the first area which may be closest to the stitch line SL and a fine wire in the second area which may be closest to the stitch line SL. Accordingly, a distance between the fine wire of first area and the fine wire of the second area may be larger than a distance between adjacent fine wires of the wire grid pattern. Thus, the polarizing function where the stitch line SL is formed may be worse than the first and second area where the first and second patterns P1 and P2 are formed.

Figure 8C:
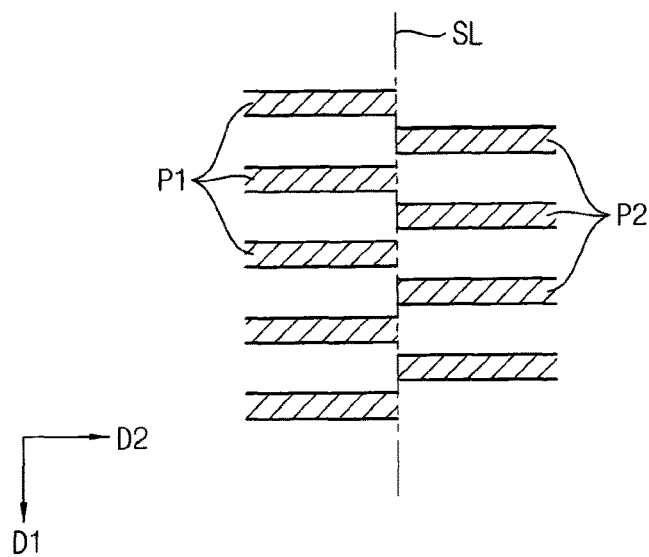

Referring to FIG. 8C, a first pattern P1 is disposed on a substrate in a first area. A second pattern P2 may be disposed on the substrate in a second area which may be adjacent to the first area in a second direction D2 which crosses a first direction D1. The second direction D2 may be substantially perpendicular to the first direction D1. The first pattern P1 and the second pattern P2 may be a metal pattern formed on a base substrate. For example, the metal pattern may a wire grid pattern having fine wires extended in the second direction D2 and spaced apart from each other in the first direction D1.

A stitch line SL may be formed between the first pattern P1 of the first area and the second pattern P2 of the second area. The stitch line SL may be a line which connects end points of the fine wires of the first pattern P1 and end points of the fine wires of the second pattern P2. The end points of the fine wires of the first pattern P1 and the end points of the fine wires of the second pattern P2 may not be aligned due to a process error. Accordingly, the polarizing function where the stitch line SL is formed may be worse than the first and second area where the first and second patterns P1 and P2 are formed.

Figure 8D:
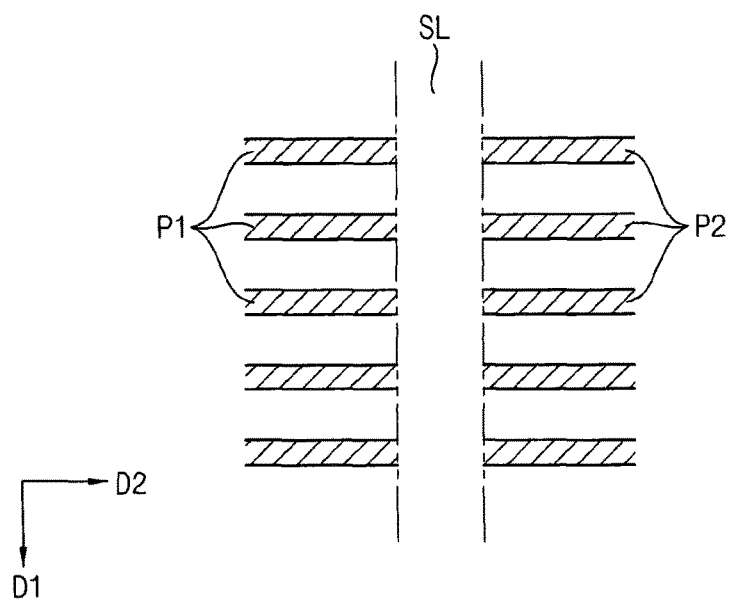

Referring to FIG. 8D, a first pattern P1 is disposed on a substrate in a first area. A second pattern P2 may be disposed on the substrate in a second area which may be adjacent to the first area in a second direction D2 which crosses a first direction D1. A stitch line SL may be formed between the first pattern P1 of the first area and the second pattern P2 of the second area. The present exemplary embodiment is substantially same as FIG. 8C, except for the stitch line SL.

The stitch line SL may be a blank pattern formed along the first direction D1. For example, the stitch line SL may be a blank area between end points of the fine wires of the first pattern P1 and end points of the fine wires of the second pattern P2. Thus, the polarizing function where the stitch line SL is formed may be worse than the first and second area where the first and second patterns P1 and P2 are formed.

Figure 8E:
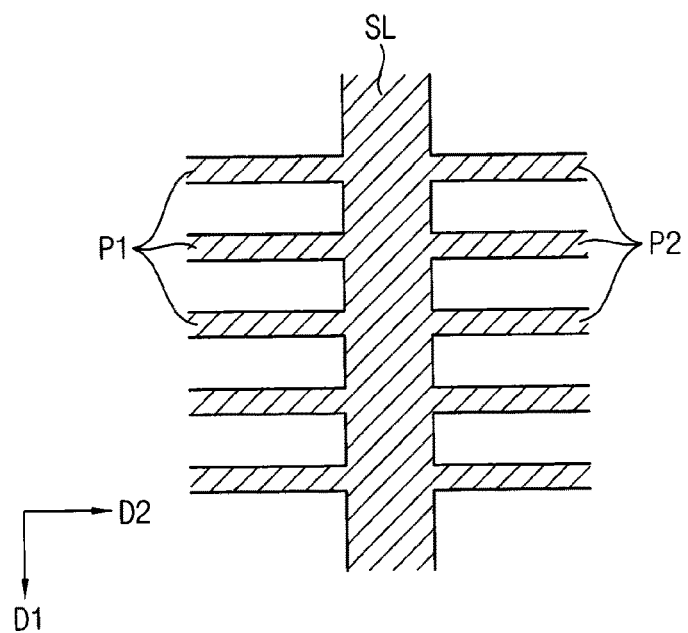

Referring to FIG. 8E, a first pattern P1 is disposed on a substrate in a first area. A second pattern P2 may be disposed on the substrate in a second area which may be adjacent to the first area in a second direction D2 which crosses a first direction D1. A stitch line SL may be formed between the first pattern P1 of the first area and the second pattern P2 of the second area. The present exemplary embodiment is substantially same as FIG. 8C, except for the stitch line SL.

The stitch line SL may be a line pattern extending in the first direction D1. For example, the stitch line SL may be a metal line pattern formed on the base substrate along the first direction D1, and make contact with the first and second patterns P1 and P2. Thus, the polarizing function where the stitch line SL is formed may be worse than the first and second area where the first and second patterns P1 and P2 are formed.

Figure 8F:
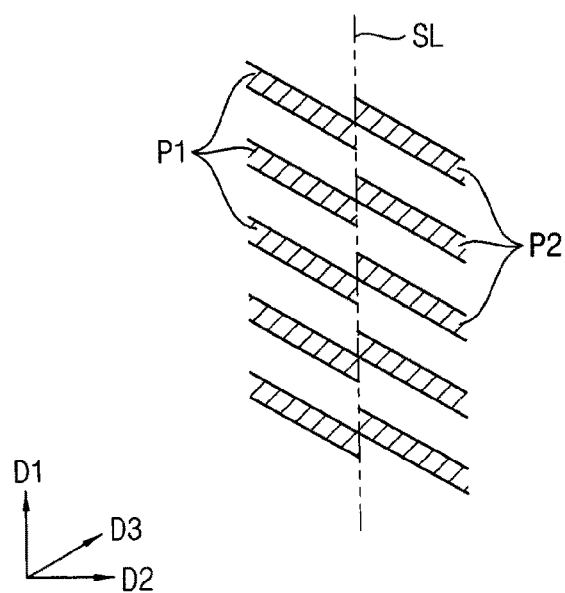

Referring to FIG. 8F, a first pattern P1 is disposed on a substrate in a first area. A second pattern P2 may be disposed on the substrate in a second area which may be adjacent to the first area in a second direction D2 which crosses a first direction D1. The second direction D2 may be substantially perpendicular to the first direction D1. The first pattern P1 and the second pattern P2 may be a metal pattern formed on a base substrate. For example, the metal pattern may be a wire grid pattern having fine wires which extend in a third direction D3 which makes an acute angle with the second direction D2 and are spaced apart each other.

A stitch line SL may be formed between the first pattern P1 of the first area and the second pattern P2 of the second area. The stitch line SL may be a line which connects end points of the fine wires of the first pattern P1 and end points of the fine wires of the second pattern P2. The end points of the fine wires of the first pattern P1 and the end points of the fine wires of the second pattern P2 may not be aligned due to process error. Accordingly, the polarizing function where the stitch line SL is formed may be worse than the first and second area where the first and second patterns P1 and P2 are formed.

Figure 8G:
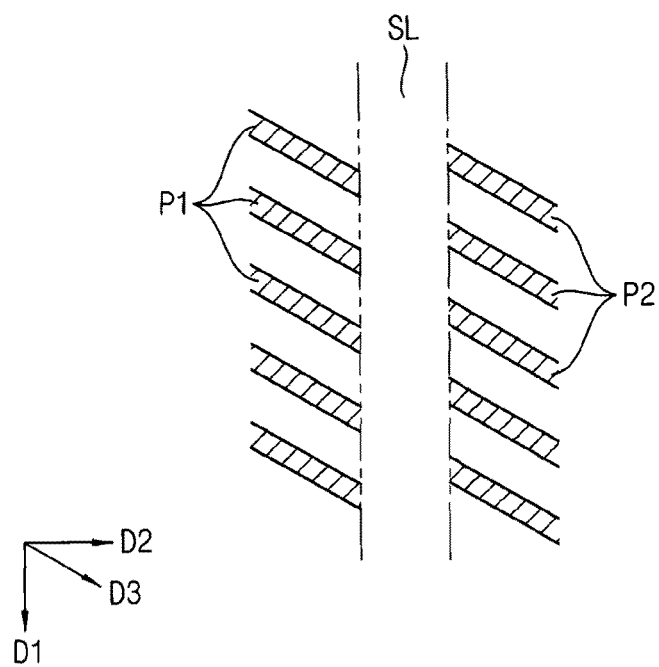

Referring to FIG. 8G, a first pattern P1 is disposed on a substrate in a first area. A second pattern P2 may be disposed on the substrate in a second area which may be adjacent to the first area in a second direction D2 which crosses a first direction D1. A stitch line SL may be formed between the first pattern P1 of the first area and the second pattern P2 of the second area. The present exemplary embodiment is substantially same as FIG. 8F, except for the stitch line SL.

The stitch line SL may be a blank pattern formed along the first direction D1. For example, the stitch line SL may be a blank area between end points of the fine wires of the first pattern P1 and end points of the fine wires of the second pattern P2. Thus, the polarizing function where the stitch line SL is formed may be worse than the first and second area where the first and second patterns P1 and P2 are formed.

Figure 8H:
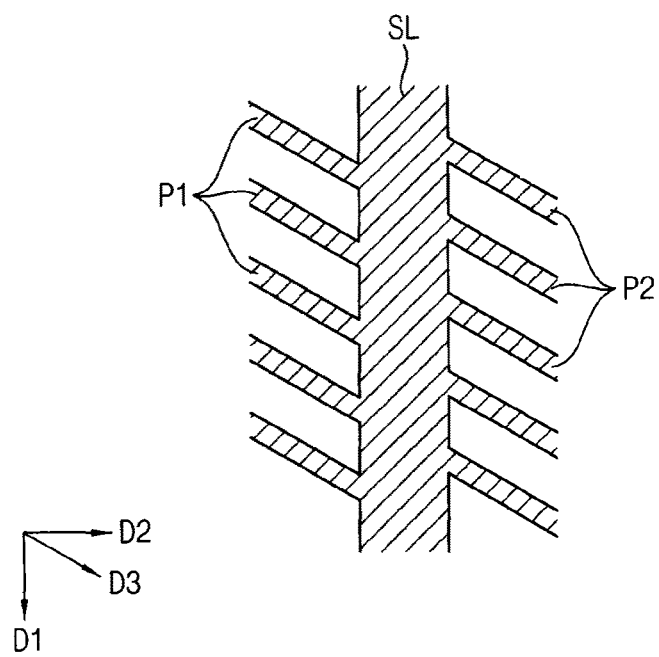

Referring to FIG. 8H, a first pattern P1 is disposed on a substrate in a first area. A second pattern P2 may be disposed on the substrate in a second area which may be adjacent to the first area in a second direction D2 which crosses a first direction D1. A stitch line SL may be formed between the first pattern P1 of the first area and the second pattern P2 of the second area. The present exemplary embodiment is substantially same as FIG. 8F, except for the stitch line SL.

The stitch line SL may be a line pattern extending in the first direction D1. For example, the stitch line SL may be a metal line pattern formed on the base substrate along the first direction D1, and make contact with the first and second patterns P1 and P2. Thus, the polarizing function where the stitch line SL is formed may be worse than the first and second area where the first and second patterns P1 and P2 are formed.

The substrate of the present exemplary embodiment may be a wire grid polarizer. In addition, the substrate may be a master template for manufacturing the wire grid polarizer.

Figure 9:
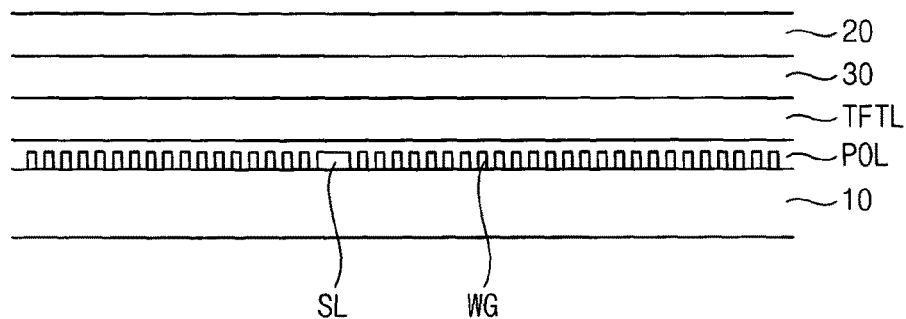
FIG. 9 is a cross-sectional view illustrating a display panel according to an exemplary embodiment of the inventive concept.

FIG. 9 is a cross-sectional view illustrating a display panel according to an exemplary embodiment of the inventive concept.

Referring to FIG. 9, the display panel may include a lower substrate, a liquid crystal layer 30 and an upper substrate 20. The lower substrate may include a first base substrate 10, a polarizer layer POL and a thin film transistor layer TFTL.

The first base substrate 10 may include a transparent insulation substrate. For example, the first base substrate 10 may include a glass substrate, a quartz substrate, a transparent resin substrate, etc.

The polarizer layer POL may be disposed on the first base substrate 10. The polarizer layer POL may be a wire grid polarizer. The polarizer layer POL may include polarizing areas where fine wires WG are formed, with a stitch line SL between the polarizing areas.

The polarizer layer POL may further include an insulation layer covering the fine wires WG and the stitch line SL.

The thin film transistor layer TFTL may be disposed on the polarizer layer POL. The thin film transistor layer TFTL may include a plurality of thin film transistors and signal lines to drive the display panel. For example, the thin film transistor layer TFTL may include a gate line, a data line crossing the data line, a thin film transistor electrically connected to the gate line and the data line, a pixel electrode electrically connected to the thin film transistor, and a plurality of insulation layers.

The upper substrate 20 may be disposed facing the lower substrate. Although not shown in the figures, the upper substrate 20 may include a second base substrate, a color filter, a light blocking pattern, and a common electrode.

The second base substrate may include a transparent insulation substrate. For example, the second base substrate may include a glass substrate, a quartz substrate, a transparent resin substrate, etc.

The color filter may provide a color to light passing through the liquid crystal layer 30. The color filter may be a red color filter, a green color filter, and a blue color filter. The color filter may be provided corresponding to each of pixels, and may be disposed to have different color corresponding to pixels adjacent each other.

The light blocking pattern may have organic or inorganic material which blocks light. For example, the light blocking pattern may include black matrix pattern including chrome oxide. The light blocking pattern may be formed where needed in order to block light.

The liquid crystal layer 30 may include liquid crystal molecules having optical anisotropy. The liquid crystal molecules are driven by electric field, so that an image may be displayed by passing or blocking light through the liquid crystal layer 30.

A common voltage may be applied to the common electrode, and a pixel voltage may be applied to the pixel electrode to drive the display panel.

Although not shown in figures, the display panel may further include an upper polarizer disposed on the upper substrate and upper and lower alignment layers contacting to the liquid crystal layer.

According to the exemplary embodiments of the present inventive concept, a large area wire grid polarizer may be manufactured by a plurality of imprint lithography processes. Thus, wire grid polarizer larger than 300 mm of diagonal length which may be a size of a traditional wafer imprint mold. In addition, by a plurality of imprint lithography processes, various large area patterns may be manufactured. The imprint lithography process may be carried out in various ways.

According to the exemplary embodiments of the present inventive concept, a master template for large area process and a wire grid polarizer may be manufactured by an imprint lithography method. For example, the master template for imprint may be formed by the method, and then an imprint mold may be duplicated using the master template, and then the wire grid polarizer may be mass-produced using the duplicated imprint mold.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An imprint lithography method, the method comprising:

forming a first imprint pattern on a substrate in a first area and a third area, wherein the third area is spaced apart from the first area;

forming a first resist pattern on the substrate on a second area, wherein the second area is adjacent to the first area and the third area;

forming a first pattern in the first and third areas by etching an element under the first imprint pattern using the first imprint pattern and the first resist pattern as an etch barrier;

forming a second imprint pattern on the substrate in the second area;

forming a second resist pattern on the substrate on the first area and the third area; and forming a second pattern in the second area by etching an element under the second imprint pattern using the second imprint pattern and the second resist pattern as an etch barrier.

2. The imprint lithography method of claim 1, wherein forming the first imprint pattern comprises:

forming the first imprint pattern in the third area after the first imprint pattern in the first area is formed.

3. The imprint lithography method of claim 2, wherein:

forming the first imprint pattern further comprises:

providing a resin solution on the substrate in the first area and the third area, and forming the first imprint pattern from the resin solution using an imprint mold; and forming the second imprint pattern further comprises:

providing the resin solution on the substrate on which the second pattern is formed in the second area, and forming the second imprint pattern from the resin solution using the imprint mold.

4. The imprint lithography method of claim 3, wherein:

forming the first imprint pattern further comprises resin solution flowing out the first imprint pattern from the first and third areas, and the first imprint pattern comprises an overflowed portion which is formed at an area outside and adjacent to the first and third areas.

5. The imprint lithography method of claim 4, wherein forming the first resist pattern further comprises covering the overflowed portion of the first imprint pattern with the first resist pattern.

6. The imprint lithography method of claim 5, wherein forming the second resist pattern further comprises a second area that is larger than the first and third areas.

7. The imprint lithography method of claim 3, wherein in forming the first imprint pattern from the resin solution comprises:

forming a first preliminary pattern from the resin solution using the imprint mold, and etching the first preliminary pattern to form the first imprint pattern; wherein the first preliminary pattern comprises a residual layer and plurality of protrusions on the residual layer, and the first imprint pattern is formed by etching the residual layer between the protrusions, wherein:

forming the second imprint pattern from the resin solution comprises:

forming a second preliminary pattern from the resin solution using the imprint mold; and etching the second preliminary pattern to form the second imprint pattern, wherein:

the second preliminary pattern comprises a residual layer and plurality of protrusions on the residual layer, and the second imprint pattern is formed by etching the residual layer between the protrusions.

8. The imprint lithography method of claim 3, wherein forming the first imprint pattern further comprises:

forming a mask layer on the substrate before providing the resin solution.

9. The imprint lithography method of claim 1, further comprising:
- forming a third imprint pattern on the substrate in a fourth area wherein the fourth area makes contact with the first, second, and third areas;
- forming a third resist pattern on the substrate on the first, second, and third areas; and
- forming a third pattern in the fourth area by etching an element under the third imprint pattern using the third imprint pattern and the third resist pattern as an etch barrier.

10. The imprint lithography method of claim 1, wherein a boundary between each of the first to third areas is discontinuously extended.

* * * * *